US 9,455,024 B1

(12) United States Patent
Dozaka

(10) Patent No.: US 9,455,024 B1
(45) Date of Patent: Sep. 27, 2016

(54) SEMICONDUCTOR MEMORY DEVICE

(71) Applicant: Kabushiki Kaisha Toshiba, Minato-ku, Tokyo (JP)

(72) Inventor: Toshiaki Dozaka, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/845,969

(22) Filed: Sep. 4, 2015

(30) Foreign Application Priority Data

Apr. 2, 2015 (JP) ................................ 2015-076067

(51) Int. Cl.
| G11C 11/00 | (2006.01) |
| G11C 11/418 | (2006.01) |
| G11C 11/419 | (2006.01) |
| G11C 5/02 | (2006.01) |
| G11C 7/10 | (2006.01) |
| G11C 7/22 | (2006.01) |

(52) U.S. Cl.
CPC ............. *G11C 11/418* (2013.01); *G11C 5/025* (2013.01); *G11C 7/1051* (2013.01); *G11C 7/1075* (2013.01); *G11C 7/22* (2013.01); *G11C 11/419* (2013.01)

(58) Field of Classification Search
CPC ..... G11C 7/1075; G11C 7/22; G11C 7/1051; G11C 7/06; G11C 5/04; G11C 5/025; G11C 11/412; G11C 11/418

USPC ................ 365/154, 156, 51, 52, 63, 189.05, 365/189.011, 189.14, 190, 226, 230.06, 365/230.08
See application file for complete search history.

(56) References Cited

U.S. PATENT DOCUMENTS

| 4,953,127 | A | * | 8/1990 | Nagahashi | ............ G11C 11/418 365/189.05 |
| 5,197,130 | A | * | 3/1993 | Chen | ....................... G06F 8/433 710/40 |
| 5,930,173 | A | * | 7/1999 | Sekiguchi | ............ G11C 16/107 365/185.22 |
| 8,284,593 | B2 | * | 10/2012 | Russell | ................ G11C 7/1075 365/149 |
| 9,257,159 | B2 | * | 2/2016 | Ware | ....................... G11C 5/14 |
| 2005/0145887 | A1 | | 7/2005 | Maeno et al. | |

FOREIGN PATENT DOCUMENTS

| JP | H08-32036 A | 2/1996 |
| JP | 2006-108397 A | 4/2006 |
| JP | 2011-228378 A | 11/2011 |
| JP | 2012-256630 A | 12/2012 |

* cited by examiner

*Primary Examiner* — Gene Auduong
(74) *Attorney, Agent, or Firm* — White & Case LLP

(57) ABSTRACT

A semiconductor memory device according to an embodiment includes first and second storages that enable writing and reading of data. The first decoding line and the third decoding line are electrically connected to each other. The first bit line and the third bit line are electrically connected to each other.

20 Claims, 17 Drawing Sheets

SEMICONDUCTOR MEMORY DEVICE

CROSS-REFERENCE TO RELATED APPLICATION

This application is based upon and claims the benefit of priority from the prior Japanese Patent Application No. 2015-076067, filed on Apr. 2, 2015, the entire contents of which are incorporated herein by reference.

BACKGROUND

1. Field

Embodiments described herein relate generally to a semiconductor memory device.

2. Background Art

In the prior art, there is a semiconductor memory device comprising a plurality of basic cells which immobilize the structure of a transistor. Then, by modifying the metal layer or the via layer, etc. are connected to the plurality of basic cells, and correspond to different operating requirements or circuit requirements of the semiconductor memory device without modifying the basic cell portion.

In the semiconductor memory device having a plurality of input and output ports, when applying the above conventional technique uses a semiconductor memory device having a maximum output ports to need as the basic cell.

However, in a typical semiconductor memory device, the number of input and output ports is increased in order to increase the area. Therefore, if a large number of ports are not used, the semiconductor memory device provides unnecessary circuits, a reduction in circuit area are not achieved.

DETAILED DESCRIPTION

A semiconductor memory device according to an embodiment includes first and second storages that enable writing and reading of data. The first storage includes a first decoding line, a first word line, a first bit line, a second decoding line, a second word line, a second bit line. The first storage includes a first decoder including an output part that outputs a signal to the first decoding line. The first storage includes a first control circuit including an output part that outputs a signal to the first word line based on a first decoding signal supplied to the first decoding line. The first storage includes a first amplifier including an output part that outputs a signal to the first bit line. The first storage includes a second decoder that outputs a signal to the second decoding line. The first storage includes a second control circuit that outputs a second control signal to the second word line based on the signal supplied to the second decoding line. The first storage includes a first memory cell that stores, in response to a first control signal supplied to the first word line, data based on a first data signal supplied to the first bit line and outputs a second data signal based on the stored data to the second bit line in response to the second control signal. The first storage includes a second amplifier that senses the signal of the second bit line and outputs a first output data signal based on the sensed signal. The second storage includes a third decoding line, a third word line, a third bit line, a fourth decoding line, a fourth word line, a fourth bit line. The second storage includes a third control circuit including an output part that outputs a signal to the third word line based on a third decoding signal supplied to the third decoding line. The second storage includes a fourth decoder that outputs a signal to the fourth decoding. The second storage includes a fourth control circuit that outputs a fourth control signal to the fourth word line based on a signal supplied to the fourth decoding line. The second storage includes a second memory cell that stores, in response to a third control signal supplied to the third word line, data based on a third data signal supplied to the third bit line and outputs a fourth data signal based on the stored data to the fourth bit line in response to the fourth control signal. The second storage includes a third amplifier that senses the signal of the fourth bit line and outputs a second output data signal based on the sensed signal. The first decoding line and the third decoding line are electrically connected to each other. The first bit line and the third bit line are electrically connected to each other.

Embodiments will be described below with reference to the accompanying drawings.

First Embodiment

Figure 1:
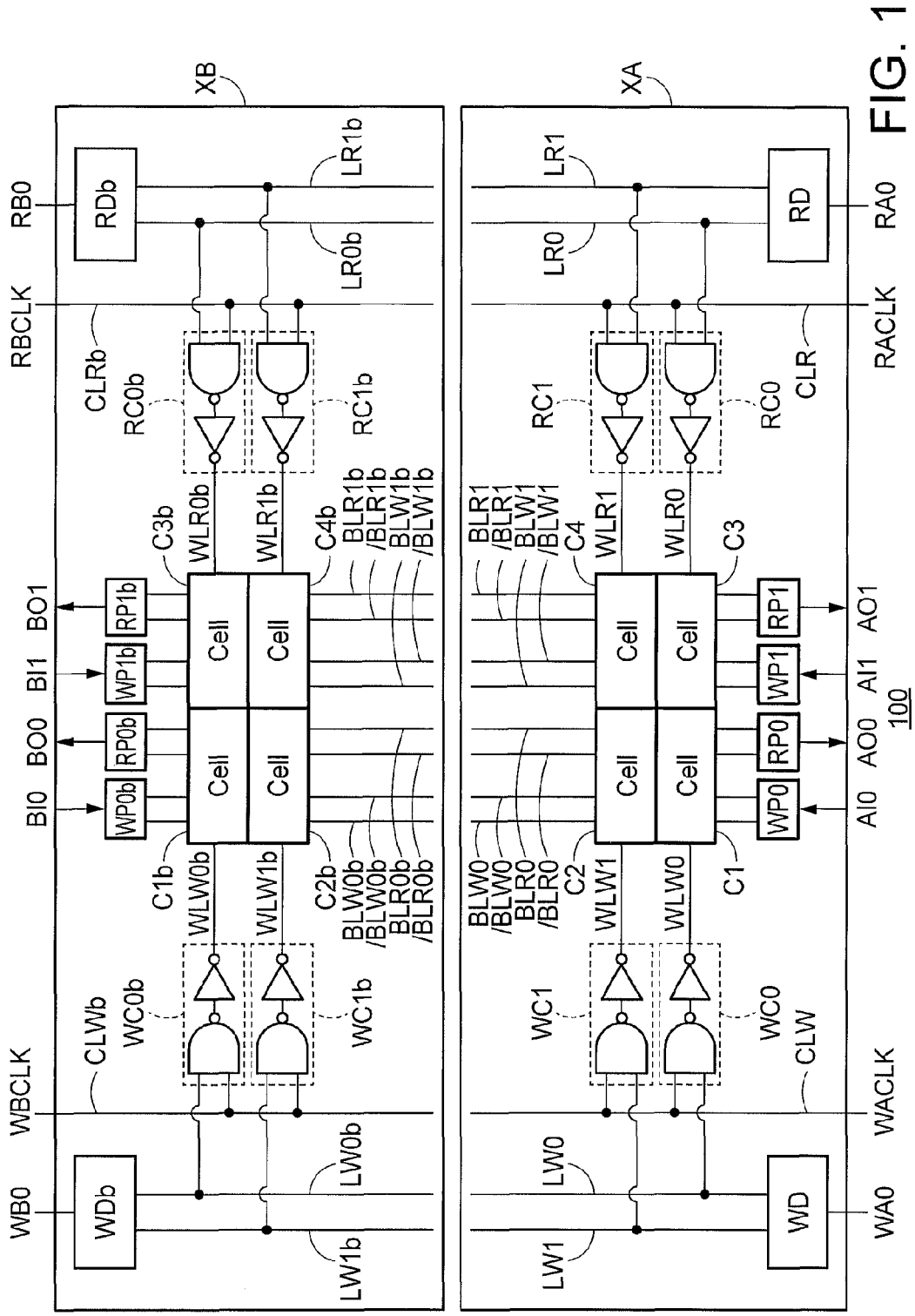
FIG. 1 is a diagram showing an example of the configuration of a semiconductor memory device 100 according to a first embodiment.

FIG. 1 shows an example of the configuration of a semiconductor memory device 100 according to a first embodiment.

As shown in FIG. 1, the semiconductor memory device 100 includes a first storage XA and a second storage XB that enable writing and reading of data. In the circuit connection of the semiconductor memory device 100 shown in FIG. 1, the semiconductor memory device 100 acts as a memory including two two-port memories.

For example, as shown in FIG. 1, the first storage XA includes first write decoding lines LW0 and LW1, first write word lines WLW0 and WLW1, first write bit lines BLW0 and BLW1, first write inverted bit lines /BLW0 and /BLW1, first read decoding lines LR0 and LR1, first read word lines WLR0 and WLR1, first read bit lines BLR0 and BLR1, first read inverted bit lines /BLR0 and /BLR1, a first write clock line CLW, and a first read clock line CLR.

For example, as shown in FIG. 1, the first storage XA further includes a first write decoder WD, first write control circuits WC0 and WC1, first write amplifiers WP0 and WP1, a first read decoder RD, first read control circuits RC0 and RC1, first memory cells C1, C2, C3, and C4, and first read sense amplifiers RP0 and RP1.

The first write decoder WD has an output part that outputs signals to the first write decoding lines LW0 and LW1 based on a signal inputted via an input terminal WA0.

The first write control circuit WC0 has an output part that outputs a signal to the first write word line WLW0 based on a first write decoding signal supplied to the first write decoding line LW0 and a signal supplied to the first write clock line CLW.

The first write control circuit WC1 has an output part that outputs a signal to the first write word line WLW1 based on a first write decoding signal supplied to the first write decoding line LW1 and a signal supplied to the first write clock line CLW.

The first write amplifier WP0 has an output part that outputs signals to the first write bit line BLW0 and the first write inverted bit line /BLW0 based on a signal inputted via an input terminal AI0.

The first write amplifier WP1 has an output part that outputs signals to the first write bit line BLW1 and the first write inverted bit line /BLW1 based on a signal inputted via an input terminal AI1.

The first read decoder RD has an output part that outputs signals to the first read decoding lines LR0 and LR1 based on a signal inputted via an input terminal RA0.

The first read control circuit RC0 outputs a first read control signal to the first read word line WLR0 based on a signal supplied to the first read decoding line LR0. The first read control circuit RC1 outputs a first read control signal to the first read word line WLR1 based on a signal supplied to the first read decoding line LR1.

The first memory cell C1 is connected to the first write word line WLW0, the first read word line WLR0, the first read bit line BLR0, the first read inverted bit line /BLR0, the first write bit line BLW0, and the first write inverted bit line /BLW0.

The first memory cell C1 stores data based on a first write data signal supplied to the first write bit line BLW0 and a first write inverted data signal that is supplied to the first write inverted bit line /BLW0 and is inverted from the logic of the first write data signal, in response to a first write control signal supplied to the first write word line WLW0.

The first memory cell C1 outputs a first read data signal based on the stored data to the first read bit line BLR0 and outputs a first read inverted data signal, which is inverted from the logic of the first read data signal, to the first read inverted bit line /BLR0 in response to the first read control signal supplied to the first read word line WLR0.

The first memory cell C2 is connected to the first write word line WLW1, the first read word line WLR1, the first read bit line BLR0, the first read inverted bit line /BLR0, the first write bit line BLW0, and the first write inverted bit line /BLW0.

The first memory cell C2 stores data based on the first write data signal supplied to the first write bit line BLW0 and the first write inverted data signal that is supplied to the first write inverted bit line /BLW0 and is inverted from the logic of the first write data signal, in response to a first write control signal supplied to the first write word line WLW1.

The first memory cell C2 outputs a first read data signal based on the stored data to the first read bit line BLR0 and outputs a first read inverted data signal, which is inverted from the logic of the first read data signal, to the first read inverted bit line /BLR0 in response to the first read control signal supplied to the first read word line WLR1.

The first memory cell C3 is connected to the first write word line WLW0, the first read word line WLR0, the first read bit line BLR1, the first read inverted bit line /BLR1, the first write bit line BLW1, and the first write inverted bit line /BLW1.

The first memory cell C3 stores data based on a first write data signal supplied to the first write bit line BLW1 and a first write inverted data signal that is supplied to the first write inverted bit line /BLW1 and is inverted from the logic of the first write data signal, in response to the first write control signal supplied to the first write word line WLW0.

The first memory cell C3 outputs a first read data signal based on the stored data to the first read bit line BLR1 and outputs a first read inverted data signal, which is inverted from the logic of the first read data signal, to the first read inverted bit line /BLR1 in response to the first read control signal supplied to the first read word line WLR0.

The first memory cell C4 is connected to the first write word line WLW1, the first read word line WLR1, the first read bit line BLR1, the first read inverted bit line /BLR1, the first write bit line BLW1, and the first write inverted bit line /BLW1.

The first memory cell C4 stores data based on a first write data signal supplied to the first write bit line BLW1 and a first write inverted data signal that is supplied to the first write inverted bit line /BLW1 and is inverted from the logic of the first write data signal, in response to the first write control signal supplied to the first write word line WLW1.

The first memory cell C4 outputs a first read data signal based on the stored data to the first read bit line BLR1 and outputs a first read inverted data signal, which is inverted from the logic of the first read data signal, to the first read inverted bit line /BLR1 in response to the first read control signal supplied to the first read word line WLR1.

The first read sense amplifier RP0 senses the signals of the first read bit line BLR0 and the first read inverted bit line /BLR0 and outputs a first output data signal to an output terminal AO0 based on the sensed signals.

The first read sense amplifier RP1 senses the signals of the first read bit line BLR1 and the first read inverted bit line /BLR1 and outputs a first output data signal to an output terminal AO1 based on the sensed signals.

For example, as shown in FIG. 1, the second storage XB includes second write decoding lines LW0*b* and LW1*b*, second write word lines WLW0*b* and WLW1*b*, second write bit lines BLW0*b* and BLW1*b*, second write inverted bit lines /BLW0*b* and /BLW1*b*, second read decoding lines LR0*b* and LR1*b*, second read word lines WLR0*b* and WLR1*b*, second read bit lines BLR0*b* and BLR1*b*, second read inverted bit lines /BLR0*b* and /BLR1*b*, a second write clock line CLWb, and a second read clock line CLRb.

For example, as shown in FIG. 1, the second storage XB further includes a second write decoder WDb, second write control circuits WC0*b* and WC1*b*, second write amplifiers WP0*b* and WP1*b*, a second read decoder RDb, second read control circuits RC0*b* and RC1*b*, second memory cells C1*b*, C2*b*, C3*b*, and C4*b*, and second read sense amplifiers RP0*b* and RP1*b*.

The second write decoder WDb has an output part that outputs signals to the second write decoding lines LW0*b* and LW1*b* based on a signal inputted via an input terminal WB0.

The second write control circuit WC0*b* has an output part that outputs a signal to the second write word line WLW0*b* based on a second write decoding signal supplied to the second write decoding line LW0*b*.

The second write control circuit WC1*b* has an output part that outputs a signal to the second write word line WLW1*b* based on a second write decoding signal supplied to the second write decoding line LW1*b*.

The second write amplifier WP0*b* has an output part that outputs signals to the second write bit line BLW0*b* and the second write inverted bit line /BLW0*b* based on a signal inputted via an input terminal BI0. The second write amplifier WP1*b* has an output part that outputs signals to the second write bit line BLW1*b* and the second write inverted bit line /BLW1*b* based on a signal inputted via an input terminal BI1.

The second read decoder RDb has an output part that outputs signals to the second read decoding lines LR0*b* and LR1*b* based on a signal inputted via an input terminal RB0.

The second read control circuit RC0*b* outputs a second read control signal to the second read word line WLR0*b* based on signals supplied to the second read decoding line LR0*b* and the clock line CLWb.

The second read control circuit RC1*b* outputs a second read control signal to the second read word line WLR1*b* based on signals supplied to the second read decoding line LR1*b* and the clock line CLWb.

The second memory cell C1*b* is connected to the second write word line WLW0*b*, the second read word line WLR0*b*, the second read bit line BLR0*b*, the second read inverted bit line /BLR0*b*, the second write bit line BLW0*b*, and the second write inverted bit line /BLW0*b*.

The second memory cell C1*b* stores data based on a second write data signal supplied to the second write bit line BLW0*b* and a second write inverted data signal that is supplied to the second write inverted bit line /BLW0*b* and is inverted from the logic of the second write data signal, in response to a second write control signal supplied to the second write word line WLW0*b*.

The second memory cell C1*b* outputs a second read data signal based on the stored data to the second read bit line BLR0*b* and outputs a second read inverted data signal, which is inverted from the logic of the second read data signal, to the second read inverted bit line /BLR0*b* in response to the second read control signal supplied to the second read word line WLR0*b*.

The second memory cell C2*b* is connected to the second write word line WLW1*b*, the second read word line WLR1*b*, the second read bit line BLR0*b*, the second read inverted bit line /BLR0*b*, the second write bit line BLW0*b*, and the second write inverted bit line /BLW0*b*.

The second memory cell C2*b* stores data based on the second write data signal supplied to the second write bit line BLW0*b* and a first write inverted data signal that is supplied to the second write inverted bit line /BLW0*b* and is inverted from the logic of the second write data signal, in response to a second write control signal supplied to the second write word line WLW1*b*.

The second memory cell C2*b* outputs a second read data signal based on the stored data to the second read bit line BLR0*b* and outputs a second read inverted data signal, which is inverted from the logic of the second read data signal, to the second read inverted bit line /BLR1*b* in response to the second read control signal supplied to the second read word line WLR1*b*.

The second memory cell C3*b* is connected to the second write word line WLW0*b*, the second read word line WLR0*b*, the second read bit line BLR1*b*, the second read inverted bit line /BLR1*b*, the second write bit line BLW1*b*, and the second write inverted bit line /BLW1*b*.

The second memory cell C3*b* stores data based on a second write data signal supplied to the second write bit line BLW1*b* and a first write inverted data signal that is supplied to the second write inverted bit line /BLW1*b* and is inverted from the logic of the second write data signal, in response to the second write control signal supplied to the second write word line WLW0*b*.

The second memory cell C3*b* outputs a second read data signal based on the stored data to the second read bit line BLR1*b* and outputs a second read inverted data signal, which is inverted from the logic of the second read data signal, to the second read inverted bit line /BLR0*b* in response to the second read control signal supplied to the second read word line WLR0*b*.

The second memory cell C4*b* is connected to the second write word line WLW1*b*, the second read word line WLR1*b*, the second read bit line BLR1*b*, the second read inverted bit line /BLR1*b*, the second write bit line BLW1*b*, and the second write inverted bit line /BLW1*b*.

The second memory cell C4*b* stores data based on the second write data signal supplied to the second write bit line BLW1*b* and the first write inverted data signal that is supplied to the second write inverted bit line /BLW1*b* and is inverted from the logic of the second write data signal, in response to the second write control signal supplied to the second write word line WLW1*b*.

The second memory cell C4*b* outputs a second read data signal based on the stored data to the second read bit line BLR1*b* and outputs a second read inverted data signal, which is inverted from the logic of the second read data signal, to the second read inverted bit line /BLR1*b* in response to the second read control signal supplied to the second read word line WLR1*b*.

The second read sense amplifier RP0*b* senses the signals of the second read bit line BLR0*b* and the second read inverted bit line /BLR0*b* and outputs a second output data signal to an output terminal BOO based on the sensed signals.

The second read sense amplifier RP1*b* senses the signals of the second read bit line BLR1*b* and the second read inverted bit line /BLR1*b* and outputs a second output data signal to the output terminal BO1 based on the sensed signals.

Figure 2:
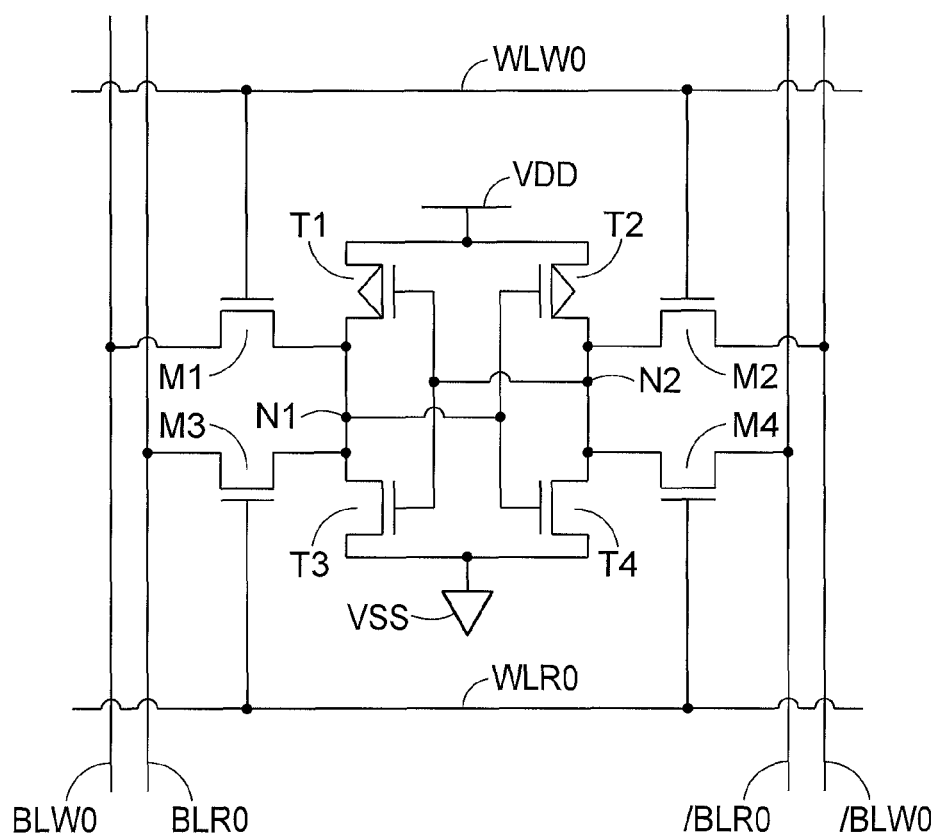
FIG. 2 is a circuit diagram showing an example of the configuration of the first memory cell C1 shown in FIG. 1.

FIG. 2 is a circuit diagram showing an example of the configuration of the first memory cell C1 shown in FIG. 1. In the example of FIG. 2, a MOS transistor of a first conductivity type is a pMOS transistor while a MOS transistor of a second conductivity type is an nMOS transistor. The MOS transistor of the first conductivity type may be an nMOS transistor while the MOS transistor of the second conductivity type may be a pMOS transistor.

For example, as shown in FIG. 2, the first memory cell C1 includes a first drive MOS transistor T1 of the first conductivity type, a second drive MOS transistor T2 of the first conductivity type, a third drive MOS transistor T3 of the second conductivity type, a fourth drive MOS transistor T4 of the second conductivity type, a first select MOS transistor M1 of the second conductivity type, a second select MOS transistor M2 of the second conductivity type, a third select MOS transistor M3 of the second conductivity type, and a fourth select MOS transistor M4 of the second conductivity type.

One end (source) of the first drive MOS transistor T1 is connected to a first potential line (power line) VDD, the other end (drain) of the first drive MOS transistor T1 is connected to a first node N1, and the gate of the first drive MOS transistor T1 is connected to a second node N2.

One end (source) of the second drive MOS transistor T2 is connected to the first potential line VDD, the other end (drain) of the second drive MOS transistor T2 is connected to the second node N2, and the gate of the second drive MOS transistor T2 is connected to the first node N1.

One end (source) of the third drive MOS transistor T3 is connected to a second potential line (ground line) VSS, the other end (drain) of the third drive MOS transistor T3 is connected to the first node N1, and the gate of the third drive MOS transistor T3 is connected to the second node N2.

One end (source) of the fourth drive MOS transistor T4 is connected to the second potential line VSS, the other end (drain) of the fourth drive MOS transistor T4 is connected to the second node N2, and the gate of the fourth drive MOS transistor T4 is connected to the first node N1.

One end (drain) of the first select MOS transistor M1 is connected to the first write bit line BLW0, the other end (source) of the first select MOS transistor M1 is connected to the first node N1, and the gate of the first select MOS transistor M1 is connected to the first write word line WLW0.

One end (drain) of the second select MOS transistor M2 is connected to the first write inverted bit line /BLW0, the other end (source) of the second select MOS transistor M2 is connected to the second node N2, and the gate of the second select MOS transistor M2 is connected to the first write word line WLW0.

One end (drain) of the third select MOS transistor M3 is connected to the first read bit line BLR0, the other end (source) of the third select MOS transistor M3 is connected to the first node N1, and the gate of the third select MOS transistor M3 is connected to the first read word line WLR0.

One end (drain) of the fourth select MOS transistor M4 is connected to the first read inverted bit line /BLR0, the other end (source) of the fourth select MOS transistor M4 is connected to the second node N2, and the gate of the fourth select MOS transistor M4 is connected to the first read word line WLR0.

The first memory cell C1 operates as a two-input two-output static random access memory (SRAM).

The first memory cells C2, C3, and C4 and the second memory cells C1b, C2b, C3b, and C4b are identical in circuit configuration to the first memory cell C1 shown in FIG. 2.

In the following example of a circuit connection, the semiconductor memory device 100 configured thus is operated as a three-port memory. As has been discussed, the two two-port memories are provided in the circuit connection of the semiconductor memory device 100 shown in FIG. 1.

Figure 3:
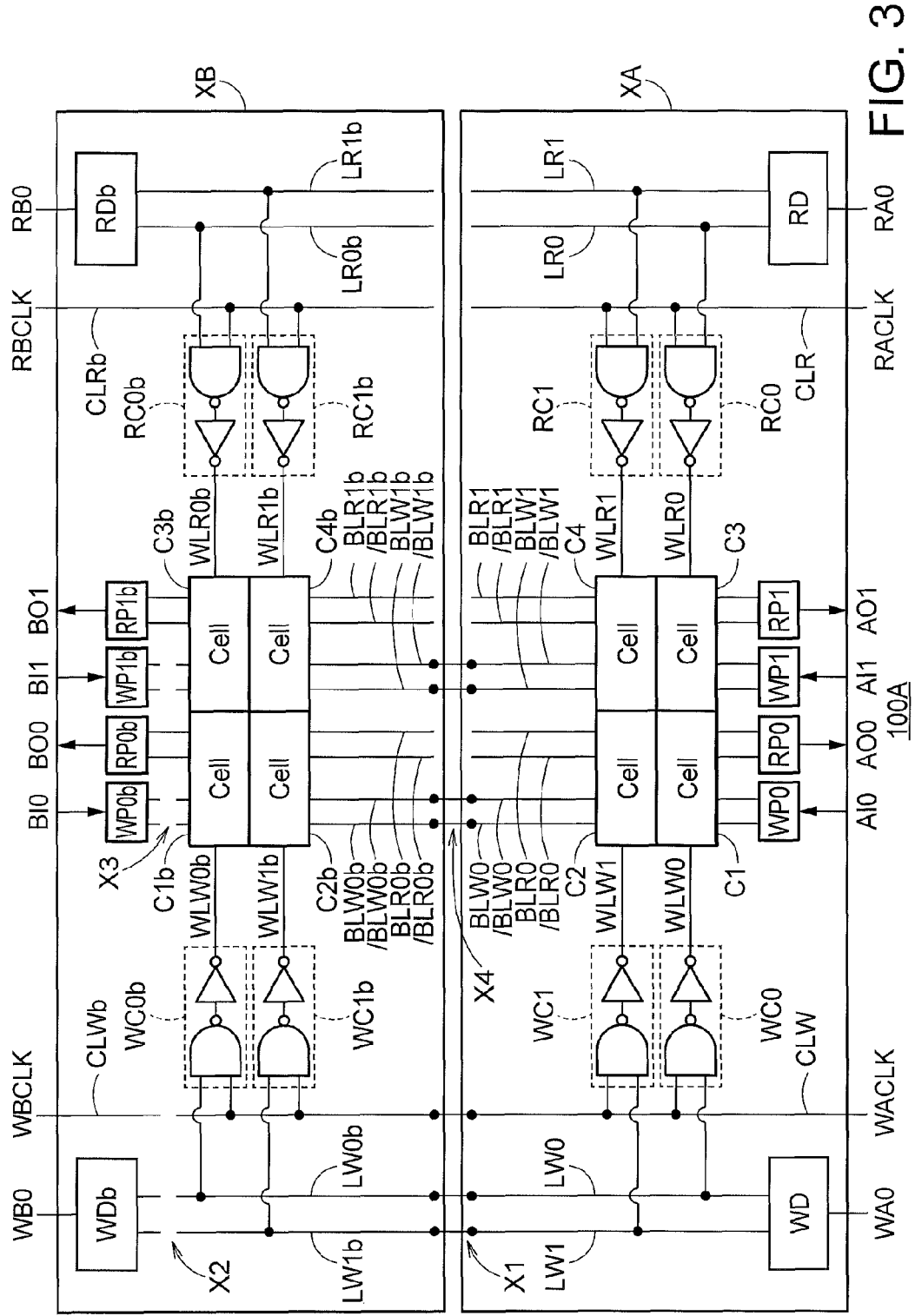
FIG. 3 is a diagram showing the example of the circuit connection (semiconductor memory device 100A) that allows the semiconductor memory device 100 in FIG. 1 to act as a three-port memory.

FIG. 3 shows the example of the circuit connection (semiconductor memory device 100A) that allows the semiconductor memory device 100 in FIG. 1 to act as a three-port memory. In FIG. 3, the same reference numerals as in FIG. 1 indicate the same configurations and the explanation thereof is omitted.

As indicated by X1 in FIG. 3, the first write decoding line LW0 and the second write decoding line LW0b are electrically connected to each other. Moreover, the first write decoding line LW1 and the second write decoding line LW1b are electrically connected to each other. Furthermore, the first write clock line CLW and the second write clock line CLWb are electrically connected to each other.

With this configuration, the first write decoder WD outputs the first write decoding signal to the first write decoding lines LW0 and LW1 in response to a first input write signal inputted via the input terminal WA0. In this case, the second write decoding signal is the first write decoding signal.

As indicated by X2 in FIG. 3, the output part of the second write decoder WDb and the second write decoding lines LW0b and LW1b are electrically insulated from each other. Moreover, the second write clock line CLWb and the input terminal WBCLK are electrically insulated from each other.

The input terminals WB0 and WBCLK are not used (do not act as ports).

As indicated by X4 in FIG. 3, the first write bit lines BLW0 and BLW1 and the second write bit lines BLW0b and BLW1b are electrically connected to each other and the first write inverted bit lines /BLW0 and /BLW1 and the second write inverted bit lines /BLW0b and /BLW1b are electrically connected to each other.

With this configuration, the first write amplifiers WP0 and WP1 output the first write data signals in response to first input data signals inputted via the input terminals AI0 and AI1. In this case, the second write data signal is the first write data signal.

As indicated by X3 in FIG. 3, the output part of the second write amplifier WP0b and the second write bit line BLW0b and the second write inverted bit line /BLW0b are electrically insulated from each other. The output part of the second write amplifier WP1b and the second write bit line BLW1b and the second write inverted bit line /BLW1b are electrically insulated from each other.

The input terminals BI0 and BI1 are not used.

The circuit connection of FIG. 3 allows the semiconductor memory device 100 to act as a three-port memory. Specifically, in the semiconductor memory device 100A, the first write word line and the second write word line simultaneously write opening data (the first write bit line and the second write bit line that are connected to one port write identical data to the memory cells Cell of the first storage XA and the second storage XB that are electrically connected to each other). The data is read from the memory cells Cell through the ports (two ports) of the first storage XA and the second storage XB. This configuration allows the semiconductor memory device 100A to act as a three-port memory.

With this configuration, the number of ports of the memory can be changed by correcting only metal layers or via layers in the semiconductor memory device 100. In the case of a small number of ports, a storage capacity can be larger than that of a large number of ports, thereby increasing the storage capacity of a circuit area.

Thus, the semiconductor memory device according to the first embodiment can reduce the circuit area.

In this example, the connection of the two two-port memories is changed to have the function of a three-port memory. However, the function of a three-port memory can be also obtained by changing the connection of two dual-port memories, each including two writing/reading ports. Specifically, the function of a three-port memory can be also obtained such that the write and read bit lines for one port are commonly connected between the two dual-port memories, the two word lines simultaneously write opening data, the data is read from the memory cells, and the data is written and read on the other ports (two ports) of the two dual port memories.

Second Embodiment

Figure 4:
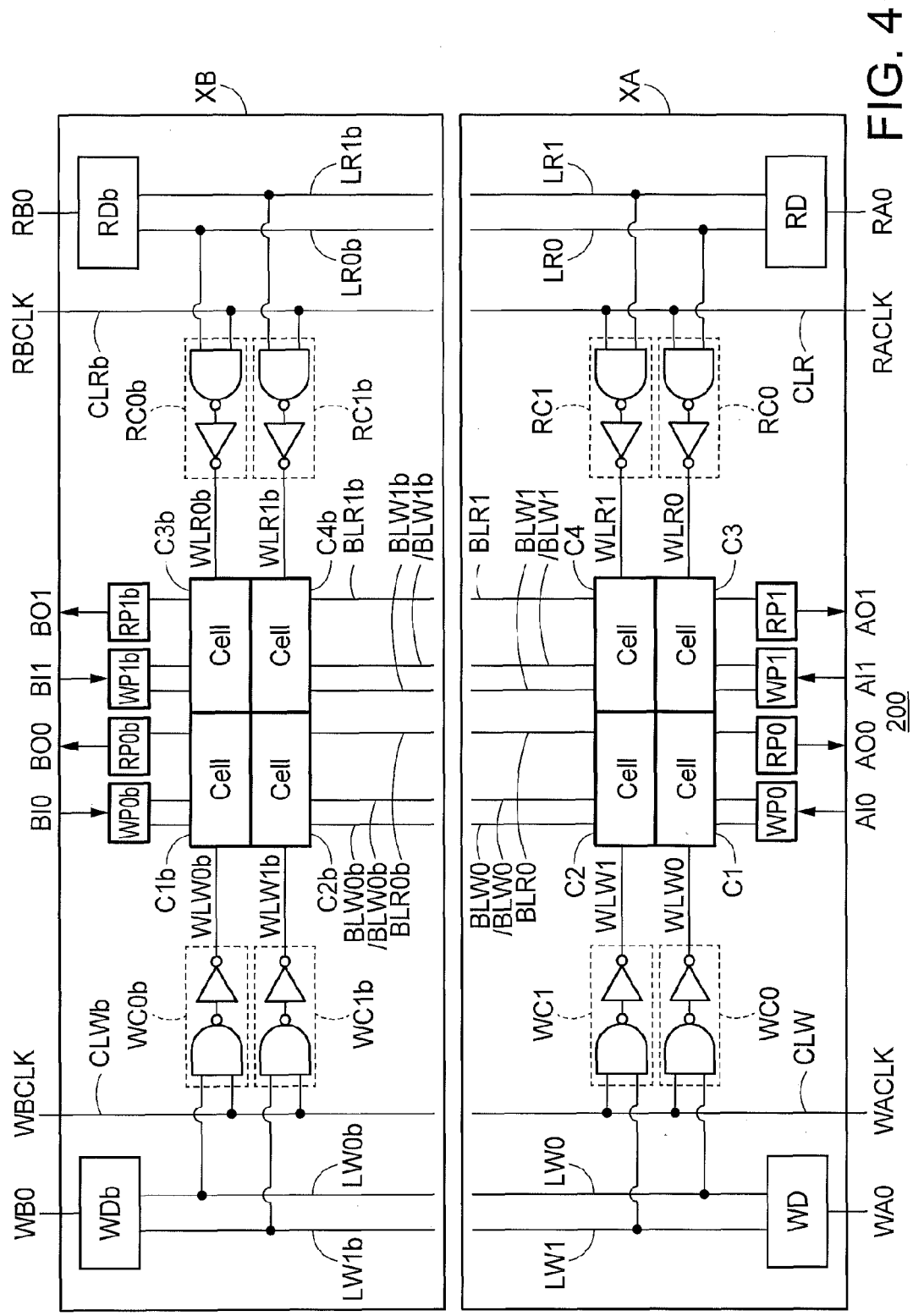
FIG. 4 is a diagram showing an example of the configuration of a semiconductor memory device 200 according to a second embodiment.

FIG. 4 shows an example of the configuration of a semiconductor memory device 200 according to a second embodiment. In FIG. 4, the same reference numerals as in FIG. 1 indicate the same configurations as those of the first embodiment and the explanation thereof is omitted.

As shown in FIG. 4, the semiconductor memory device 200 includes a first storage XA and a second storage XB that enable writing and reading of data. In the circuit connection of the semiconductor memory device 200 shown in FIG. 4, two two-port memories are provided.

As shown in FIG. 4, unlike in the configuration of FIG. 1, the first read inverted bit lines /BLR0 and /BLR1 are omitted in the first storage XA.

As shown in FIG. 4, unlike in the configuration of FIG. 1, the second read inverted bit lines /BLR0b and /BLR1b are further omitted in the second storage XB.

Other configurations of the semiconductor memory device 200 are identical to those of the semiconductor memory device 100 shown in FIG. 1.

Figure 5:
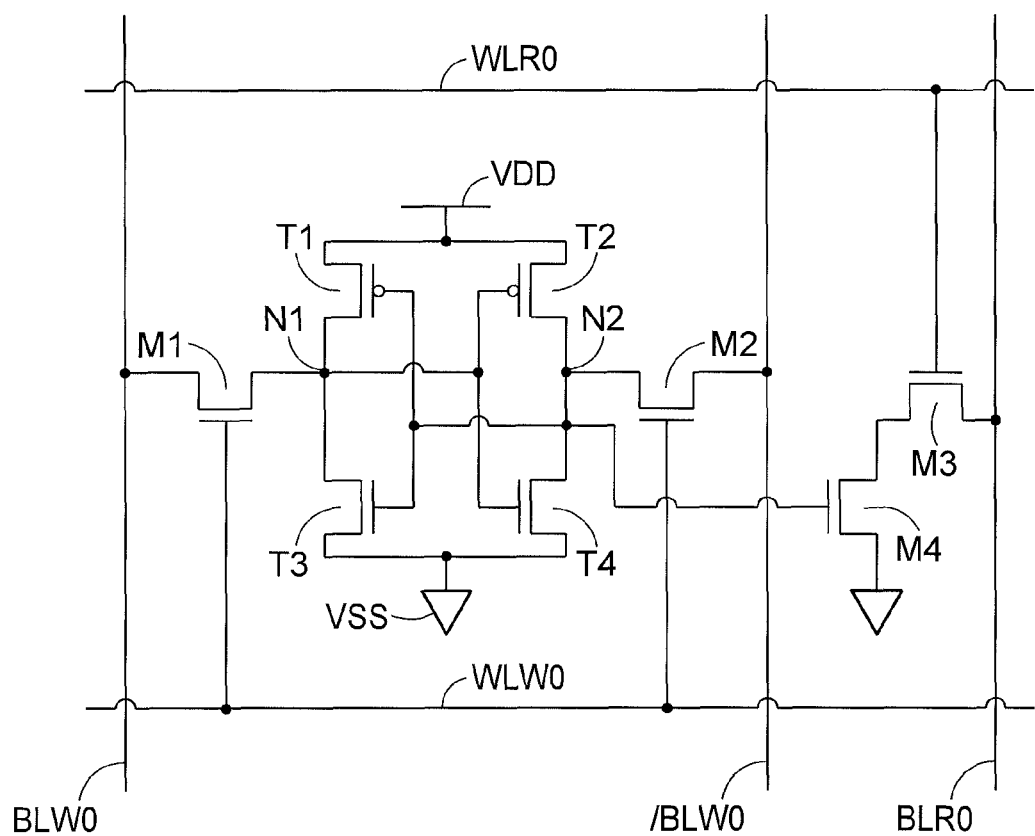
FIG. 5 is a circuit diagram showing an example of the configuration of a first memory cell C1 in FIG. 4.

FIG. 5 is a circuit diagram showing an example of the configuration of a first memory cell C1 in FIG. 4.

As shown in FIG. 5, the first memory cell C1 includes, for example, a first drive MOS transistor T1 of a first conductivity type, a second drive MOS transistor T2 of the first conductivity type, a third drive MOS transistor T3 of a second conductivity type, a fourth drive MOS transistor T4 of the second conductivity type, a first select MOS transistor M1 of the second conductivity type, a second select MOS transistor M2 of the second conductivity type, a third select MOS transistor M3 of the second conductivity type, and a fourth select MOS transistor M4 of the second conductivity type.

One end (source) of the first drive MOS transistor T1 is connected to a first potential line (power line) VDD, the other end (drain) of the first drive MOS transistor T1 is connected to a first node N1, and the gate of the first drive MOS transistor T1 is connected to a second node N2.

One end (source) of the second drive MOS transistor T2 is connected to the first potential line VDD, the other end (drain) of the second drive MOS transistor T2 is connected to the second node N2, and the gate of the second drive MOS transistor T2 is connected to the first node N1.

One end (source) of the third drive MOS transistor T3 is connected to a second potential line (ground line) VSS, the other end (drain) of the third drive MOS transistor T3 is connected to the first node N1, and the gate of the third drive MOS transistor T3 is connected to the second node N2.

One end (source) of the fourth drive MOS transistor T4 is connected to the second potential line VSS, the other end (drain) of the fourth drive MOS transistor T4 is connected to the second node N2, and the gate of the fourth drive MOS transistor T4 is connected to the first node N1.

One end (drain) of the first select MOS transistor M1 is connected to a first write bit line BLW0, the other end (source) of the first select MOS transistor M1 is connected to the first node N1, and the gate of the first select MOS transistor M1 is connected to a first write word line WLW0.

One end (drain) of the second select MOS transistor M2 is connected to a first write inverted bit line /BLW0, the other end (source) of the second select MOS transistor M2 is connected to the second node N2, and the gate of the second select MOS transistor M2 is connected to the first write word line WLW0.

One end (drain) of the third select MOS transistor M3 is connected to a first read bit line BLR0 and the gate of the third select MOS transistor M3 is connected to a first read word line WLR0.

One end (drain) of the fourth select MOS transistor M4 is connected to the other end (source) of the third select MOS transistor M3, the other end (source) of the fourth select MOS transistor M4 is connected to the second potential line VSS, and the gate of the fourth select MOS transistor M4 is connected to the second node N2.

The first memory cell C1 acts as a two-input one-output SRAM.

Other first memory cells C2, C3, and C4 and second memory cells C1b, C2b, C3b, and C4b are also identical in circuit configuration to the first memory cell C1 shown in FIG. 5.

In the following example of a circuit connection, the semiconductor memory device 200 configured thus acts as a three-port memory.

Figure 6:
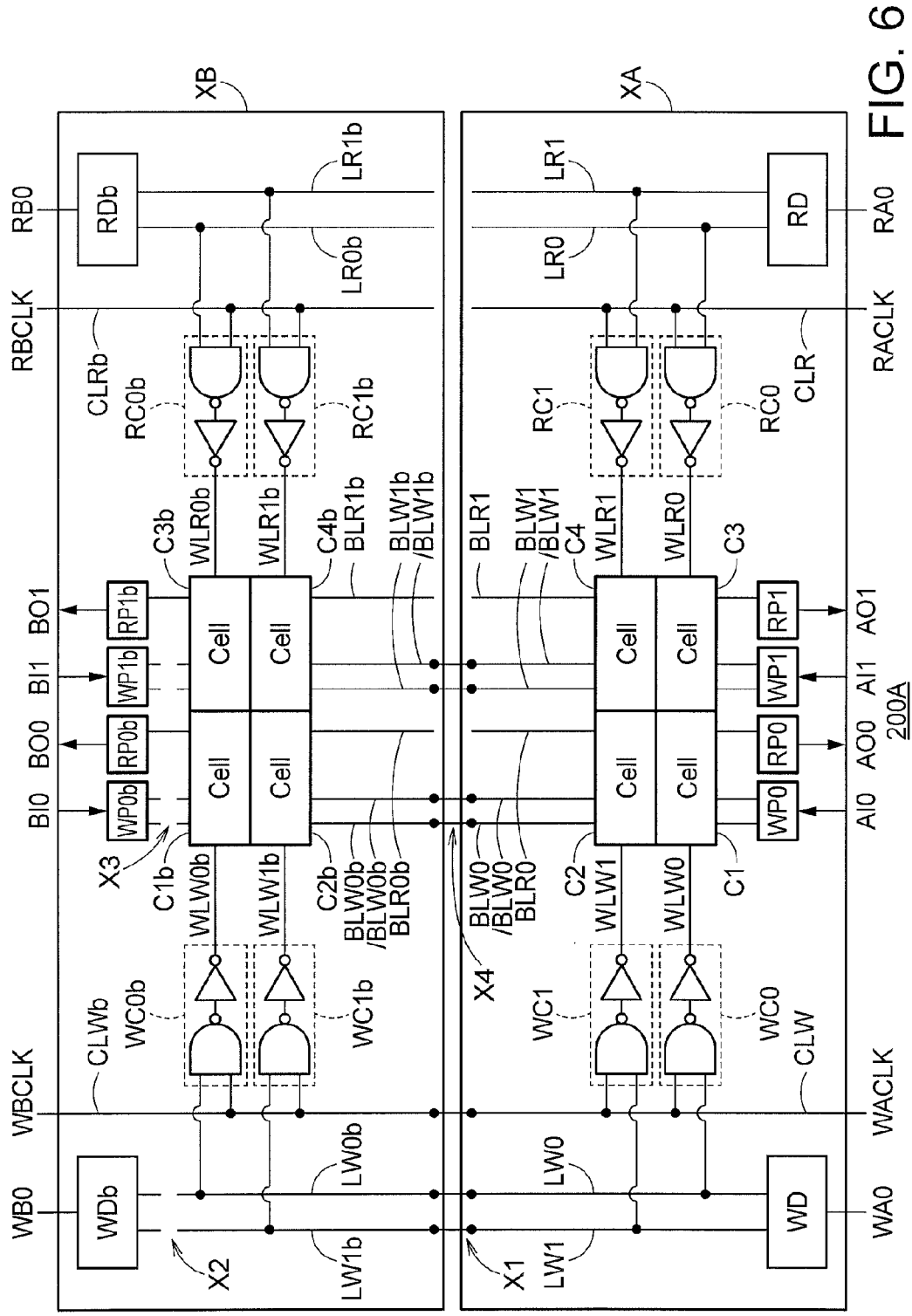
FIG. 6 is a diagram showing the example of the circuit connection (semiconductor memory device 200A) that allows the semiconductor memory device 200 in FIG. 4 to act as a three-port memory.

FIG. 6 shows the example of the circuit connection (semiconductor memory device 200A) that allows the semiconductor memory device 200 in FIG. 4 to act as a three-port memory. In FIG. 6, the same reference numerals as in FIG. 3 indicate the same configurations and the explanation thereof is omitted.

Unlike in the circuit configuration of FIG. 3, the first read inverted bit lines /BLR0 and /BLR1 and the second read inverted bit lines /BLR0b and /BLR1b are omitted in the circuit configuration of FIG. 6. Other circuit configurations are identical to those of FIG. 3.

Thus, the circuit connection of FIG. 3 allows the semiconductor memory device 100 to act as a three-port memory. Specifically, in the semiconductor memory device 200A, a first write word line and a second write word line simultaneously write opening data (write the same data to two memory cells Cell), the data is read from the memory cells Cell through ports, allowing the semiconductor memory device 200A to act as a three-port memory.

Other functions of the semiconductor memory device 200 configured thus are similar to those of the first embodiment.

As in the first embodiment, the number of ports of the memory can be changed by correcting only metal layers or via layers in the semiconductor memory device 200 according to the second embodiment. In the case of a small number of ports, a storage capacity can be larger than that of a large number of ports, thereby increasing the storage capacity per a circuit area.

Third Embodiment

Figure 7:
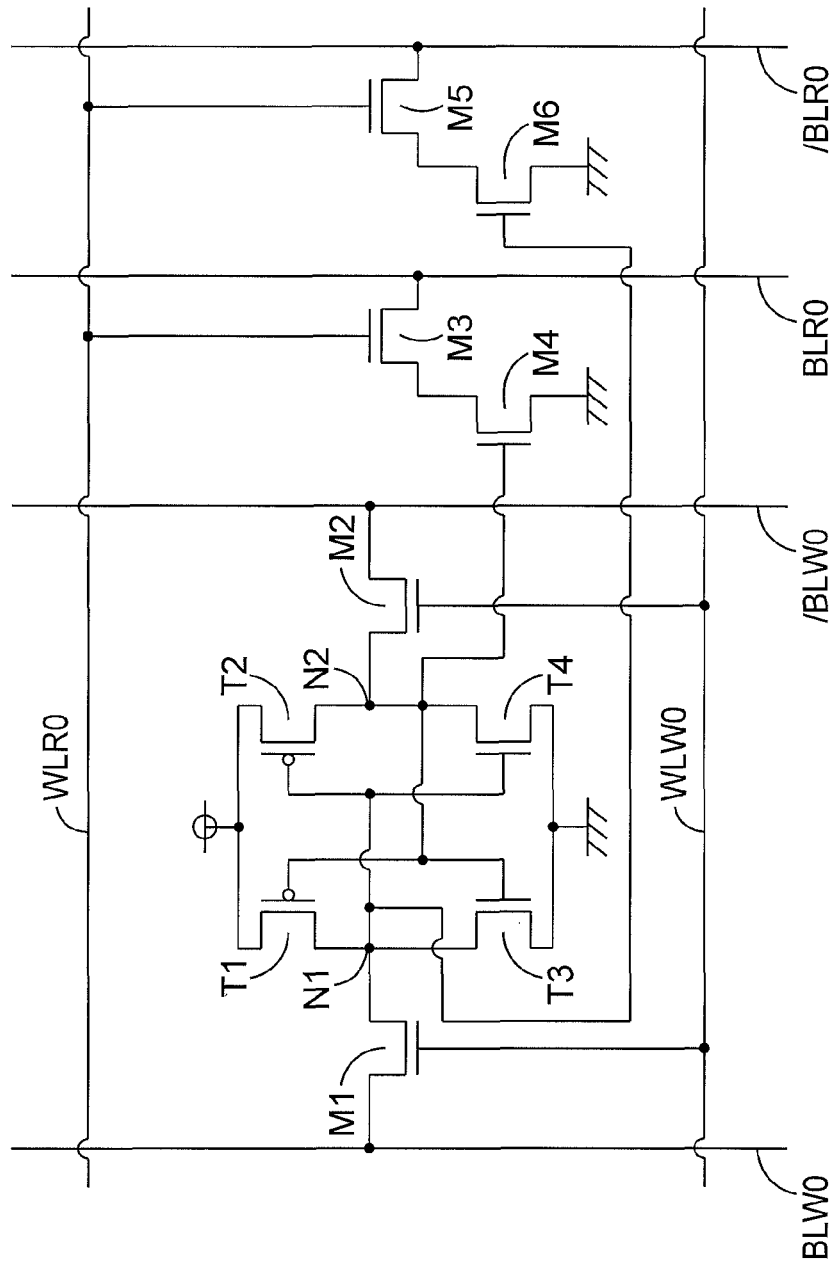
FIG. 7 is a circuit diagram of another configuration example of the first memory cell C1 shown in FIG. 1.

FIG. 7 is a circuit diagram of another configuration example of the first memory cell C1 shown in FIG. 1. In FIG. 7, the same reference numerals as in FIG. 5 indicate the same configurations and the explanation thereof is omitted.

As shown in FIG. 7, the first memory cell C1 further includes a fifth select MOS transistor M5 of a second conductivity type and a sixth select MOS transistor M6 of the second conductivity type unlike in the circuit configuration of FIG. 5.

One end (drain) of the fifth select MOS transistor M5 is connected to a first read inverted bit line /BLR0 and the gate of the fifth select MOS transistor M5 is connected to a first read word line WLR0.

One end (drain) of the sixth select MOS transistor M6 is connected to the other end (source) of the fifth select MOS transistor M5, the other end of the sixth select MOS transistor M6 is connected to a second potential line VSS, and the gate of the sixth select MOS transistor M6 is connected to a first node N1.

The first memory cell C1 operates as a two-input two-output SRAM.

Other first memory cells C2, C3, and C4 and second memory cells C1b, C2b, C3b, and C4b are identical in circuit configuration to the first memory cell C1 shown in FIG. 7.

With this configuration, the first memory cells C1, C2, C3, and C4 and the second memory cells C1b, C2b, C3b, and C4b are applied to the semiconductor memory device 100 shown in FIG. 1. In an example of a circuit connection that allows a semiconductor memory device 100 including the first memory cells C1, C2, C3, and C4 shown in FIG. 7 to act as a three-port memory, the circuit connection is identical to that of FIG. 3 (semiconductor memory device 100A).

As has been discussed, the circuit connection shown in FIG. 3 allows the semiconductor memory device to act as a three-port memory. Specifically, in the semiconductor memory device according to the present embodiment, a first write word line and a second write word line simultaneously write opening data (write the same data to the two memory cells). The data is read from the memory cells through ports, allowing the semiconductor memory device to act as a three-port memory.

The semiconductor memory device configured thus has the same function as in the first embodiment.

Specifically, as in the first embodiment, the number of ports of the memory can be changed by correcting only metal layers or via layers in the semiconductor memory device according to the third embodiment. In the case of a small number of ports, a storage capacity can be larger than that of a large number of ports, thereby increasing the storage capacity of a circuit area.

Fourth Embodiment

A fourth embodiment will describe still another example of a circuit connection that allows a semiconductor memory device to act as a three-port memory.

Figure 8:
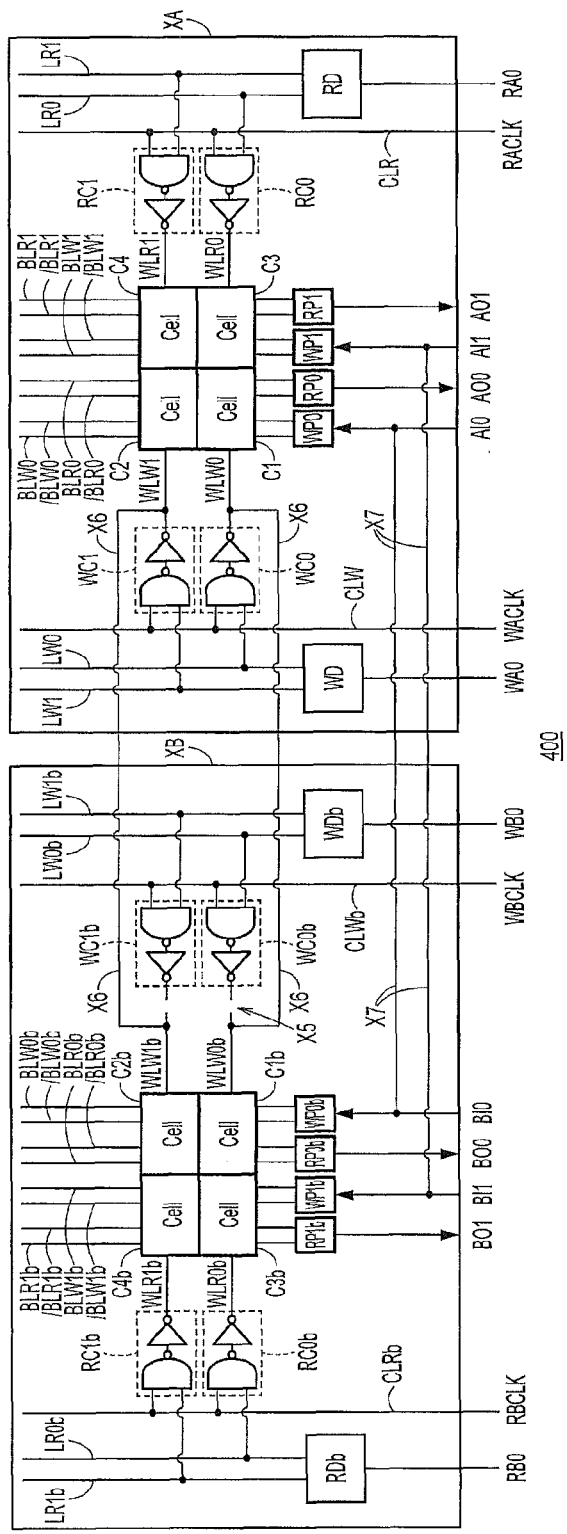
FIG. 8 is a diagram showing an example of a circuit connection that allows the semiconductor memory device shown in FIG. 1 to act as a three-port memory.

FIG. 8 show an example of a circuit connection that allows the semiconductor memory device shown in FIG. 1 to act as a three-port memory. In FIG. 1, the first storage XA and the second storage XB are vertically disposed, whereas in FIG. 8, a first storage XA and a second storage XB are horizontally disposed. In FIG. 8, the same reference numerals as in FIG. 1 indicate the same configurations and the explanation thereof is omitted.

As shown in FIG. 8, a semiconductor memory device 400 includes the first storage XA and the second storage XB that enable writing and reading of data.

As indicated by X5 in FIG. 8, the output parts of second write control circuits WC0b and WC1b and second write word lines WLW0b and WLW1b are electrically insulated from each other.

Moreover, as indicated by X6 in FIG. 8, first write word lines WLW0 and WLW1 and the second write word lines WLW0b and WLW1b are electrically connected to each other. The output parts of first write control circuits WC0 and WC1 and the first write word line WLW0 and WLW1 are electrically connected to each other.

With this configuration, a first write decoder WD outputs a first write decoding signal to the first write word lines WLW0 and WLW1 in response to a first input write signal WA0. Furthermore, second write decoding signals from the second write word lines WLW0b and WLW1b are the first write decoding signals.

As indicated by X7 in FIG. 8, the input parts of second write amplifiers WP0b and WP1b are connected to the input parts of first write amplifiers WP0 and WP1.

With this configuration, the first write amplifiers WP0 and WP1 output first write data signals in response to first input data signals inputted through input terminals AI0 and AI1. Moreover, the second write amplifiers WP0b and WP1b output second write data signals in response to the first input data signals inputted through the input terminals AI0 and AI1.

Thus, the circuit connection of FIG. 8 allows the semiconductor memory device 400 to act as a three-port memory. Specifically, in the semiconductor memory device 400, a first write word line and a second write word line simultaneously write opening data (write the same data to two memory cells) and the data is read from the memory cells through ports, allowing the semiconductor memory device 400 to act as a three-port memory.

Other functions of the semiconductor memory device 400 configured thus are identical to those of the first embodiment.

As in the first embodiment, the number of ports of the memory can be changed by correcting only metal layers or via layers in the semiconductor memory device 400 according to the fourth embodiment. In the case of a small number of ports, a storage capacity can be larger than that of a large number of ports, thereby increasing the storage capacity per a circuit area.

Fifth Embodiment

A fifth embodiment will describe still another example of a circuit connection that allows a semiconductor memory device to act as a two-port memory.

Figure 9:
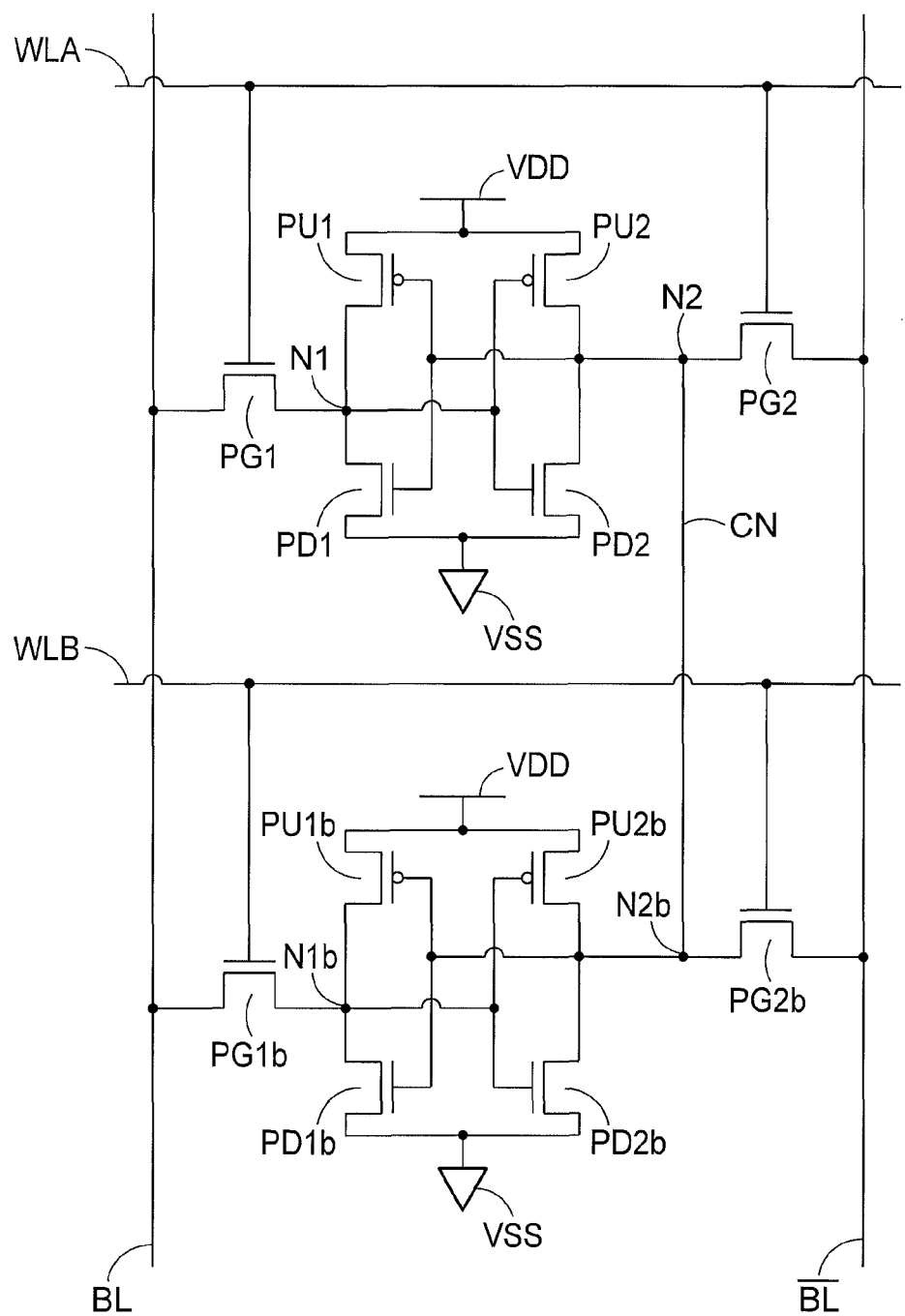
FIG. 9 is a circuit diagram of a configuration example of a semiconductor memory device 500 according to the fifth embodiment.
Figure 10:
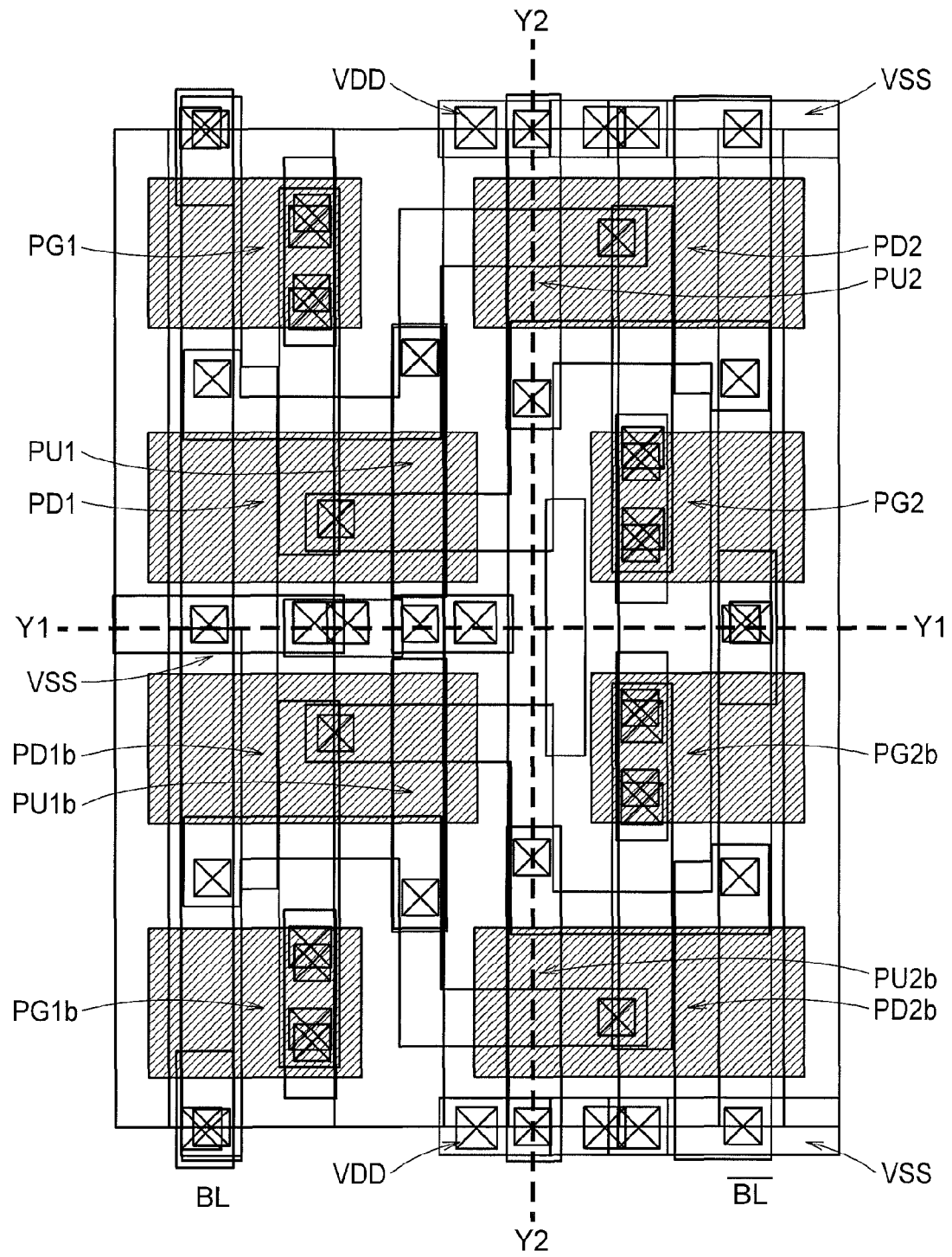
FIG. 10 is a diagram showing a layout example of the semiconductor memory device 500 shown in FIG. 9.
Figure 11:
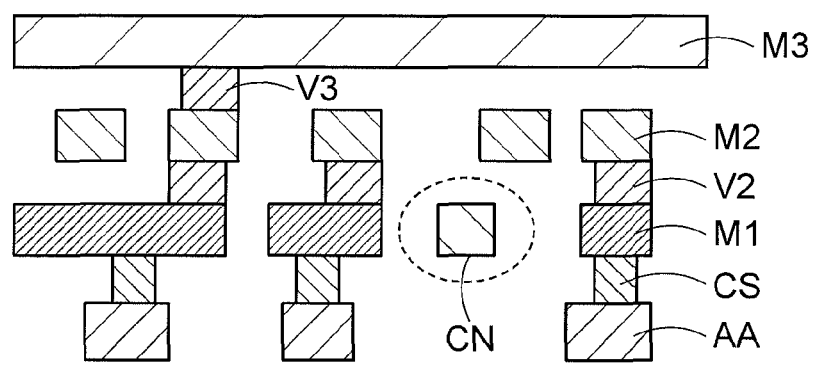
FIG. 11 is a cross-sectional view showing an example of a cross section taken along line Y1-Y1 of FIG. 10.
Figure 12:
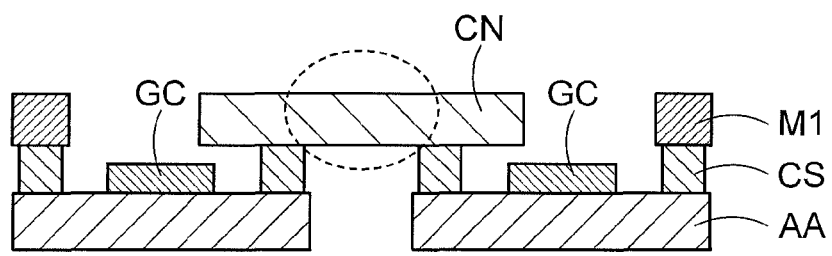
FIG. 12 is a cross-sectional view showing an example of a cross section taken along line Y2-Y2 of FIG. 10.

FIG. 9 is a circuit diagram of a configuration example of a semiconductor memory device 500 according to the fifth embodiment. FIG. 10 shows a layout example of the semiconductor memory device 500 shown in FIG. 9. FIG. 11 is a cross-sectional view showing an example of a cross section taken along line Y1-Y1 of FIG. 10. FIG. 12 is a cross-sectional view showing an example of a cross section taken along line Y2-Y2 of FIG. 10. In the example of FIG. 9, a MOS transistor of a first conductivity type is illustrated as a pMOS transistor and a MOS transistor of a second conductivity type is illustrated as an nMOS transistor. However, the MOS transistor of the first conductivity type may be an nMOS transistor and the MOS transistor of the second conductivity type may be a pMOS transistor.

As shown in FIGS. 9 to 12, the semiconductor memory device 500 includes a first word line WLA, a second word line WLB, a first bit line BL, a second bit line /BL, a first select MOS transistor PG1 of the second conductivity type, a second select MOS transistor PG2 of the second conductivity type, a first drive MOS transistor PU1 of the first conductivity type, a second drive MOS transistor PU2 of the first conductivity type, a first drive MOS transistor PD1 of the second conductivity type, a fourth drive MOS transistor PD2 of the second conductivity type, a third select MOS transistor PG1b of the second conductivity type, a fourth select MOS transistor PG2b of the second conductivity type, a fifth drive MOS transistor PU1b of the first conductivity type, a sixth drive MOS transistor PU2b of the first conductivity type, a seventh drive MOS transistor PD1b of the second conductivity type, an eighth drive MOS transistor PD2b of the second conductivity type, and a connecting wire CN.

One end (drain) of the first select MOS transistor PG1 is connected to the first bit line BL, the other end (source) of the first select MOS transistor PG1 is connected to a first node N1, and the gate of the first select MOS transistor PG1 is connected to the first word line WLA.

One end (drain) of the second select MOS transistor PG2 is connected to the second bit line /BL, the other end (source) of the second select MOS transistor PG2 is connected to a second node N2, and the gate of the second select MOS transistor PG2 is connected to the first word line WLA.

One end (source) of the first drive MOS transistor PU1 is connected to a first potential line (power line) VDD, the other end (drain) of the first drive MOS transistor PU1 is connected to the first node N1, and the gate of the first drive MOS transistor PU1 is connected to the second node N2.

One end (source) of the second drive MOS transistor PU2 is connected to the first potential line VDD, the other end of the second drive MOS transistor PU2 is connected to the second node N2, and the gate of the second drive MOS transistor PU2 is connected to the first node N1.

One end (source) of the third drive MOS transistor PD1 is connected to a second potential line (ground line) VSS, the other end (drain) of the third drive MOS transistor PD1 is connected to the first node N1, and the gate of the third drive MOS transistor PD1 is connected to the second node N2.

One end (source) of the fourth drive MOS transistor PD2 is connected to the second potential line VSS, the other end (drain) of the fourth drive MOS transistor PD2 is connected to the second node N2, and the gate of the fourth drive MOS transistor PD2 is connected to the first node N1.

The first and second select MOS transistors PG1 and PG2 and the first, second, third, and fourth drive MOS transistors PU1, PU2, PD1, and PD2 constitute an SRAM.

One end (drain) of the third select MOS transistor PG1b is connected to the first bit line BL, the other end (source) of the third select MOS transistor PG1b is connected to a third node N1b, and the gate of the third select MOS transistor PG1b is connected to the second word line WLB.

One end (drain) of the fourth select MOS transistor PG2b is connected to the second bit line /BL, the other end (source) of the fourth select MOS transistor PG2b is connected to a fourth node N2b, and the gate of the fourth select MOS transistor PG2b is connected to the second word line WLB.

One end (source) of the fifth drive MOS transistor PU1b is connected to the first potential line VDD, the other end (drain) of the fifth drive MOS transistor PU1b is connected to the third node N1b, and the gate of the fifth drive MOS transistor PU1b is connected to the fourth node N2b.

One end (source) of the sixth drive MOS transistor PU2b is connected to the first potential line VDD, the other end (drain) of the sixth drive MOS transistor PU2b is connected to the fourth node N2b, and the gate of the sixth drive MOS transistor PU2b is connected to the third node N1b.

One end (source) of the seventh drive MOS transistor PD1b is connected to the second potential line VSS, the other end (drain) of the seventh drive MOS transistor PD1b is connected to the third node N1b, and the gate of the seventh drive MOS transistor PD1b is connected to the fourth node N2b.

One end (source) of the eighth drive MOS transistor PD2b is connected to the second potential line VSS, the other end (drain) of the eighth drive MOS transistor PD2b is connected to the fourth node N2B, and the gate of the eighth drive MOS transistor PD2b is connected to the third node N1b.

The third and fourth select MOS transistors PG1b and PG2b, the fifth, sixth, seventh, and eighth drive MOS transistors PU1b, PU2b, PD1b, and PD2b constitute an SRAM.

In this way, the semiconductor memory device 500 includes two memory cells (SRAM).

As shown in FIGS. 10 to 12, the semiconductor memory device 500 includes an activated region AA where the MOS transistor is formed, a wiring layer CS where a gate electrode layer GC is provided, a metal layer M1 provided on the wiring layer CS, a via layer V2 provided on the metal layer M1, a metal layer M2 provided on the via layer V2, a via layer V3 provided on the metal layer M2, a metal layer M3 provided on the via layer V3.

The second node N2 and the fourth node N2b are electrically connected to each other via the connecting wire CN provided in the metal layer M1. The connecting wire CN may be provided in other layers, e.g., the wiring layer CS or the gate electrode layer GC. As described above, one ends (drains) of the first and third select MOS transistors PG1 and PG1b are connected to the first bit line BL. Moreover, one ends (drains) of the second and fourth select MOS transistors PG2 and PG2b are connected to the second bit line /BL. This configuration allows the semiconductor memory device 500 to act as a two-port memory having two selecting lines (the first and second word lines WLA and WLB).

As described above, in the semiconductor memory device according to the fifth embodiment, the number of ports of the memory can be changed by correcting only the metal layers or the via layers. In the case of a small number of ports, a storage capacity can be larger than that of a large number of ports, thereby increasing the storage capacity per a circuit area.

Sixth Embodiment

A sixth embodiment will describe still another example of a circuit connection that allows a semiconductor memory device to act as a two-port memory.

Figure 13:
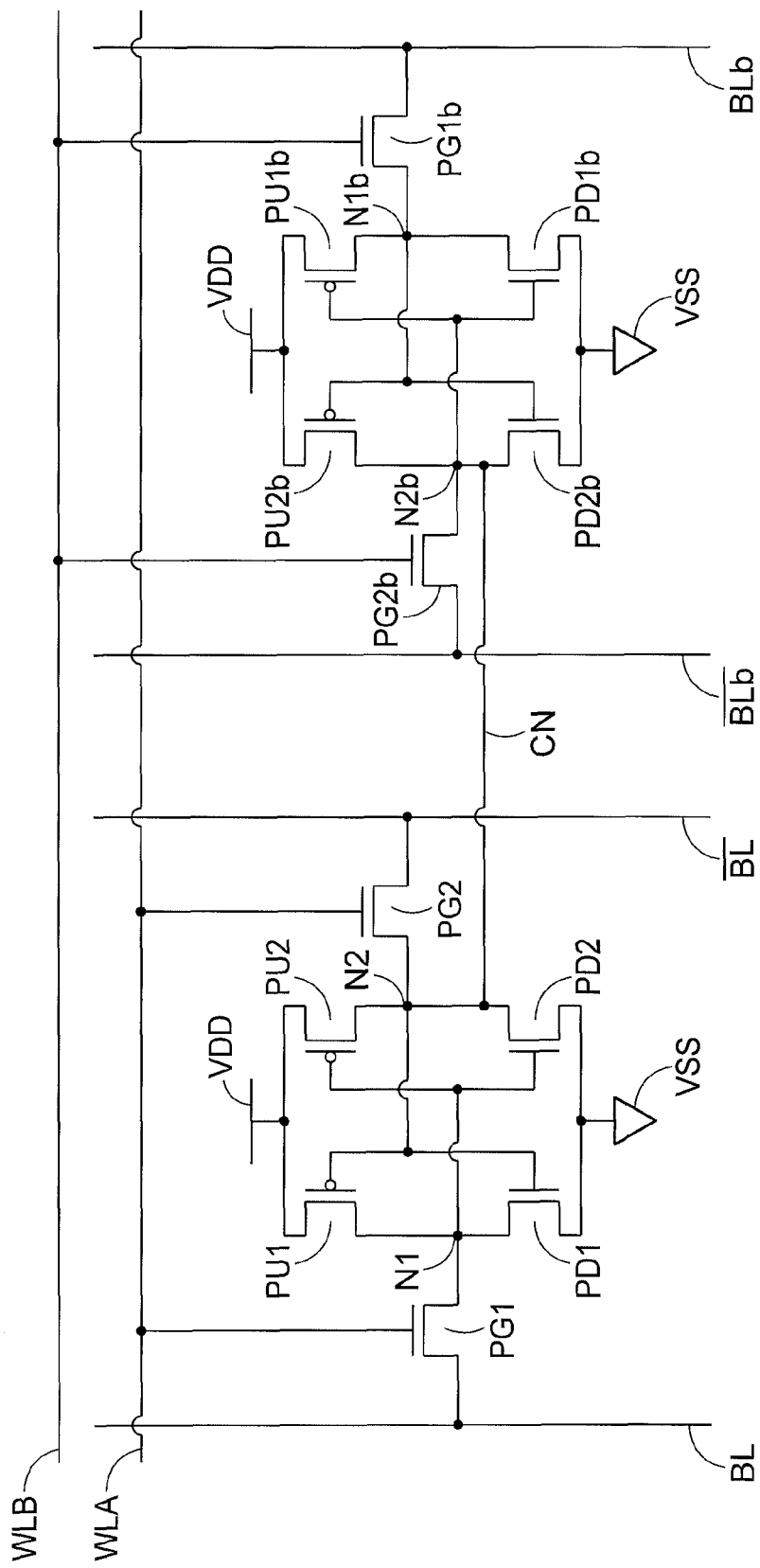
FIG. 13 is a circuit diagram showing a configuration example of a semiconductor memory device 600 according to the sixth embodiment.
Figure 14:
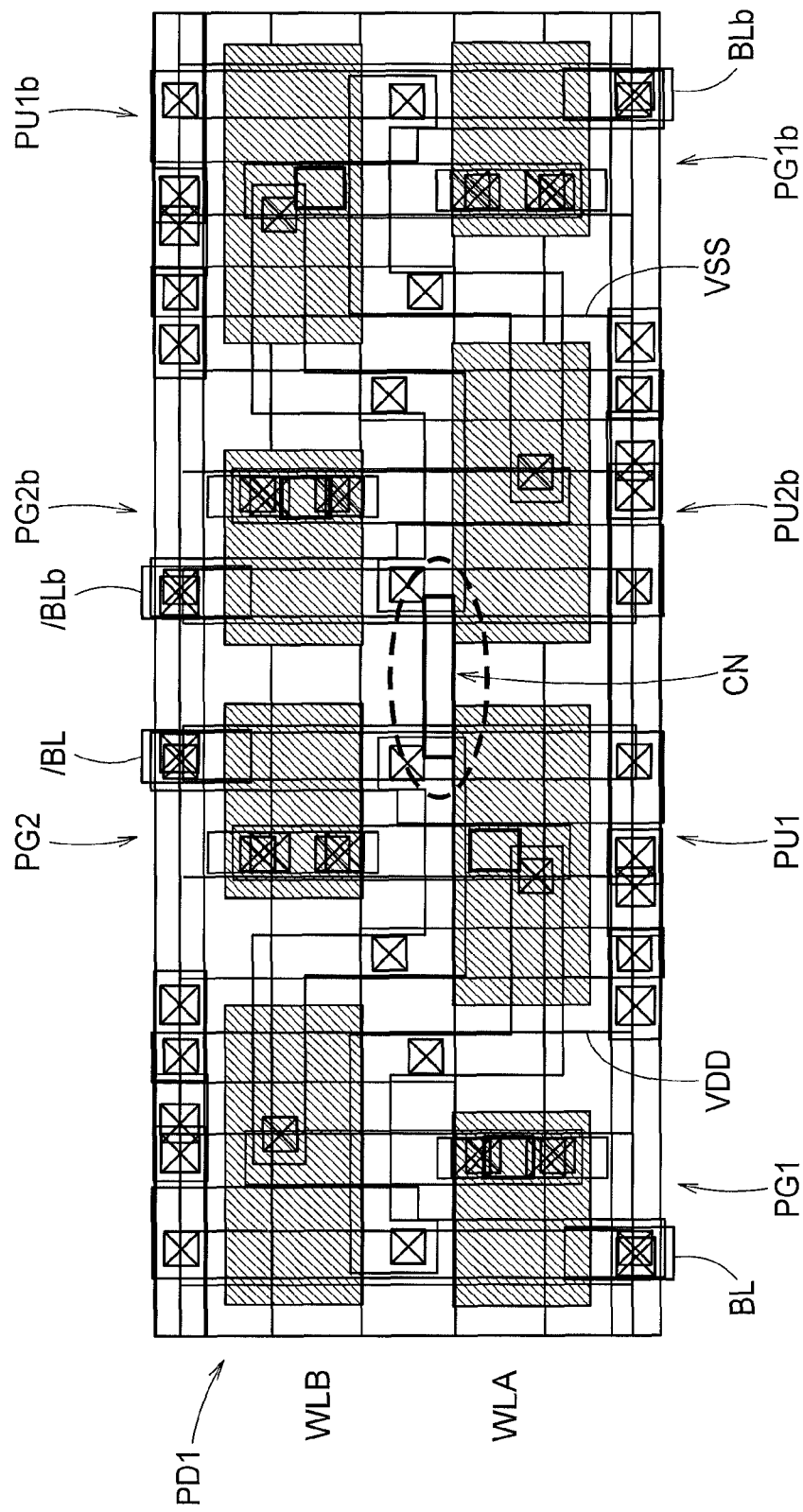
FIG. 14 is a diagram showing a layout example of the semiconductor memory device 600 shown in FIG. 13.

FIG. 13 is a circuit diagram showing a configuration example of a semiconductor memory device 600 according to the sixth embodiment. FIG. 14 shows a layout example of the semiconductor memory device 600 shown in FIG. 13. In FIGS. 13 and 14, the same reference numerals as in FIGS. 9 and 10 indicate the same configurations and the explanation thereof is omitted.

As shown in FIGS. 13 and 14, the semiconductor memory device 600 further includes a third bit line BLb and a fourth bit line /BLb unlike in the fifth embodiment.

In this configuration, one end (drain) of the third select MOS transistor PG1b is connected to the third bit line BLb, the other end (source) of the third select MOS transistor PG1b is connected to a third node N1b, and the gate of the third select MOS transistor PG1b is connected to a second word line WLB.

One end (drain) of the fourth select MOS transistor PG2b is connected to the fourth bit line /BLb, the other end (source) of the fourth select MOS transistor PG2b is connected to a fourth node N2b, and the gate of the fourth select MOS transistor PG2b is connected to the second word line WLB.

Moreover, a second node N2 and the fourth node N2b are electrically connected to each other via a connecting wire CN provided in a metal layer M1.

This configuration allows the semiconductor memory device 600 to act as a two-port memory having two selecting lines (first and second word lines WLA and WLB).

Other configurations of the semiconductor memory device 600 are identical to those of the semiconductor memory device 500 according to the fifth embodiment.

As described above, the number of ports of the memory can be changed by correcting only metal layers or via layers in the semiconductor memory device according to the sixth embodiment. In the case of a small number of ports, a storage capacity can be larger than that of a large number of ports, thereby increasing the storage capacity per a circuit area.

Seventh Embodiment

A seventh embodiment will describe still another example of a circuit connection that allows a semiconductor memory device to act as a two-port memory.

Figure 15:
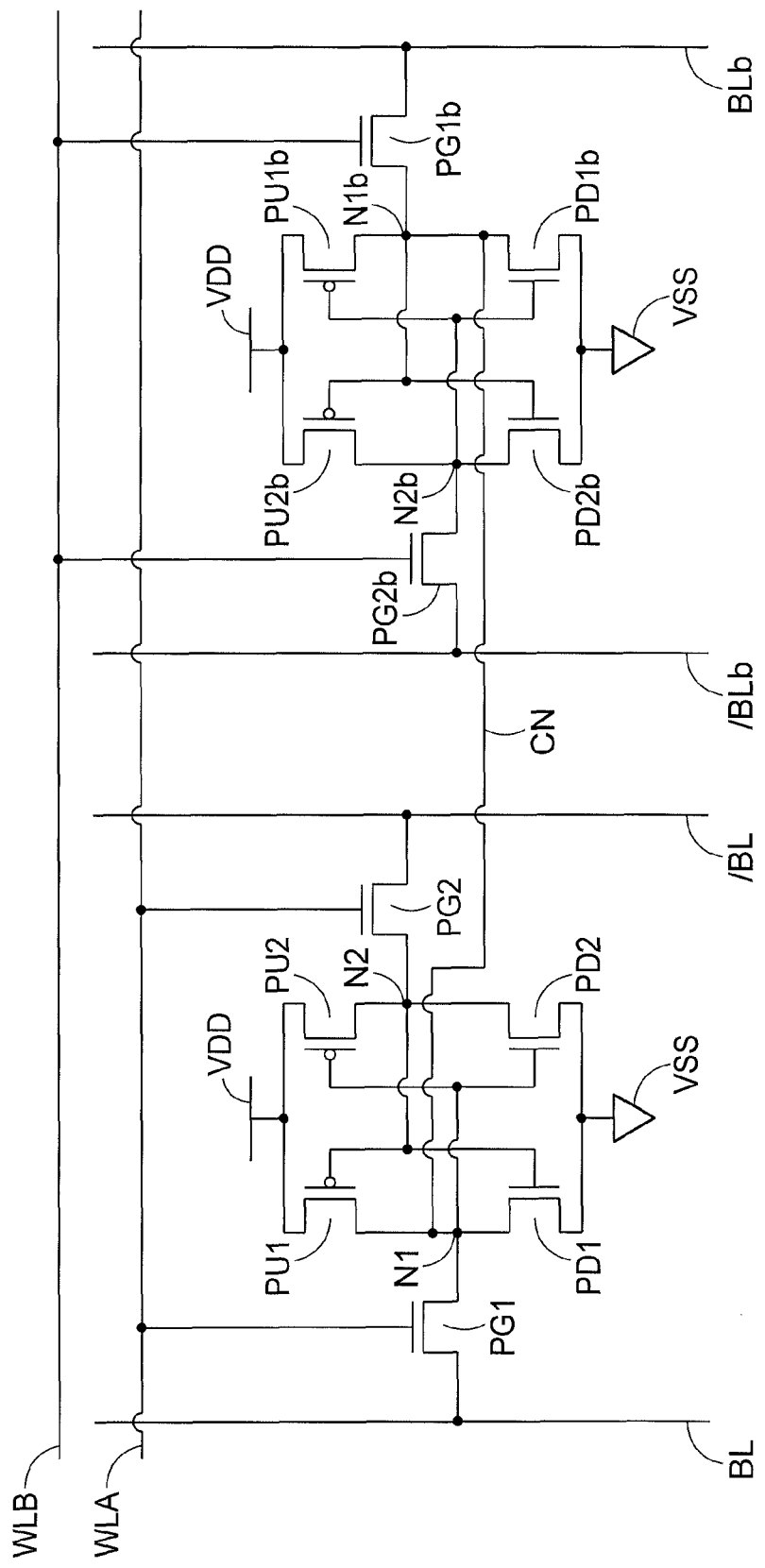
FIG. 15 is a circuit diagram showing a configuration example of a semiconductor memory device 700 according to the seventh embodiment.
Figure 16:
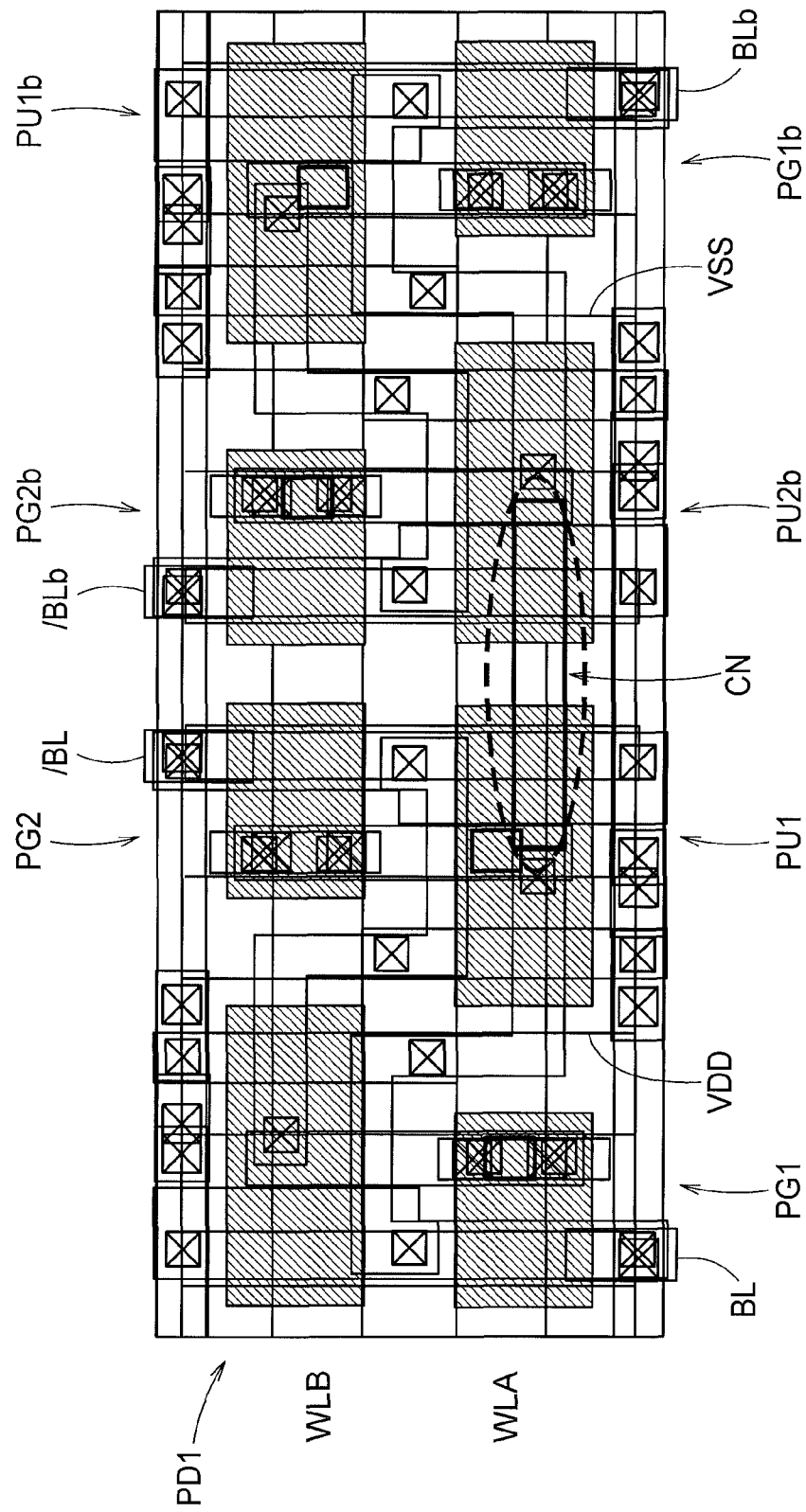
FIG. 16 is a diagram showing a layout example of the semiconductor memory device 700 shown in FIG. 15.

FIG. 15 is a circuit diagram showing a configuration example of a semiconductor memory device 700 according to the seventh embodiment. FIG. 16 shows a layout example of the semiconductor memory device 700 shown in FIG. 15. In FIGS. 15 and 16, the same reference numerals as in FIGS. 9 and 10 indicate the same configurations and the explanation thereof is omitted.

As shown in FIGS. 15 and 16, the semiconductor memory device 700 further includes a third bit line BLb and a fourth bit line /BLb unlike in the fifth embodiment.

One end (drain) of a third select MOS transistor PG1b is connected to the third bit line BLb, the other end (source) of the third select MOS transistor PG1b is connected to a third node N1b, and the gate of the third select MOS transistor PG1b is connected to a second word line WLB.

One end (drain) of a fourth select MOS transistor PG2b is connected to the fourth bit line /BLb, the other end (source) of the fourth select MOS transistor PG2b is connected to a fourth node N2b, and the gate of the fourth select MOS transistor PG2b is connected to the second word line WLB.

The first node N1 and the third node N1b are electrically connected to each other via a connecting wire CN provided in a metal layer M1. The connecting wire CN may be provided in other layers, e.g., a wiring layer CS or a gate electrode layer GC.

This configuration allows the semiconductor memory device 700 to act as a two-port memory having two selecting lines (first and second word lines WLA and WLB).

Other configurations of the semiconductor memory device 700 are identical to those of the semiconductor memory device 500 according to the fifth embodiment.

This configuration eliminates the need for a circuit for an adjustable input/output port in the semiconductor memory device 700. Thus, the absence of used ports eliminates unnecessary circuits, reducing a circuit area.

As described above, in the semiconductor memory device according to the seventh embodiment, the number of ports of the memory can be changed by correcting only metal layers or via layers. In the case of a small number of ports, a storage capacity can be larger than that of a large number of ports, thereby increasing the storage capacity of per circuit area.

Eighth Embodiment

An eighth embodiment will describe still another example of a circuit connection that allows a semiconductor memory device to act as a two-port memory.

Figure 17:
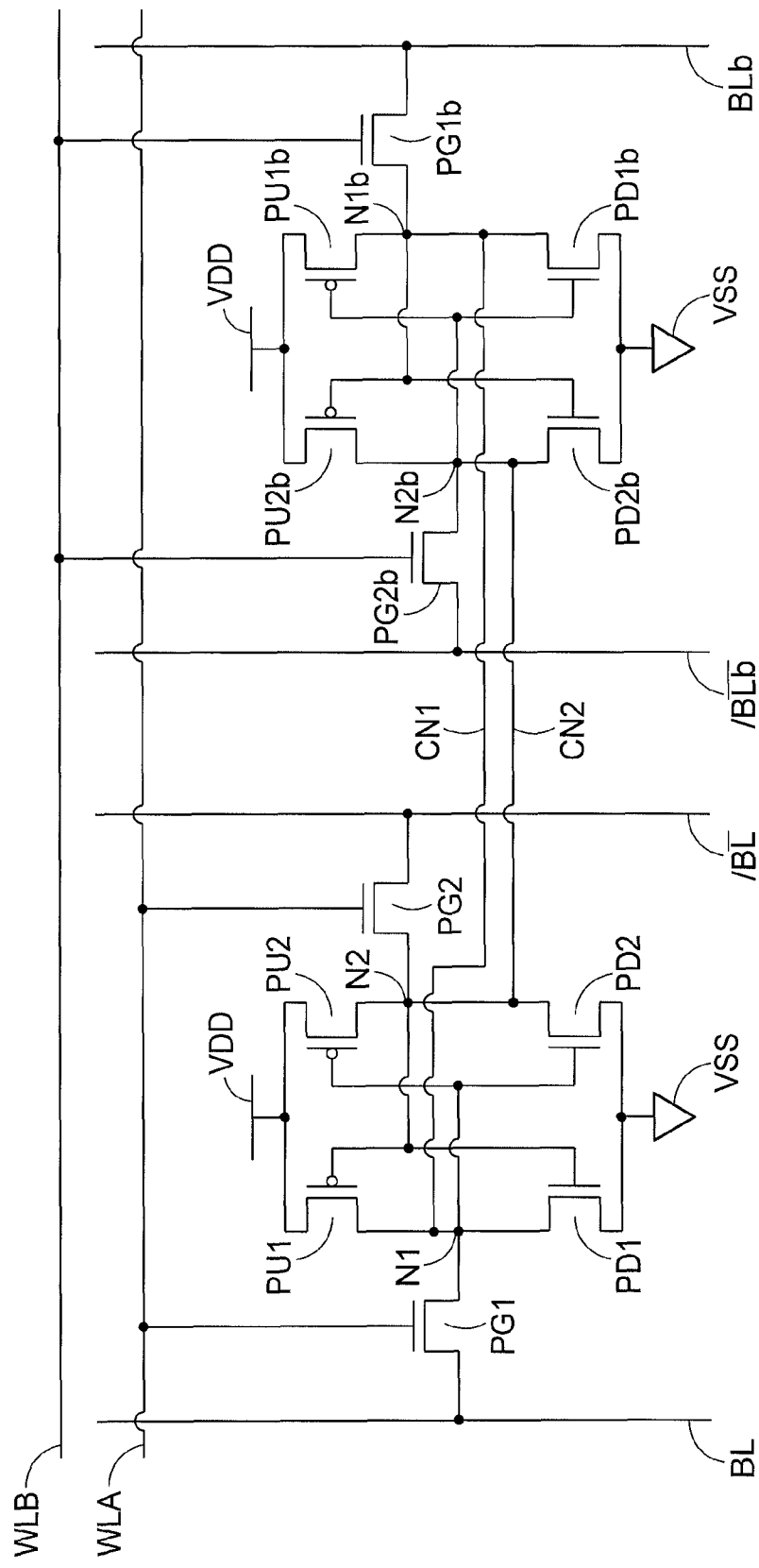
FIG. 17 is a circuit diagram showing a configuration example of a semiconductor memory device 800 according to the eighth embodiment.
Figure 18:
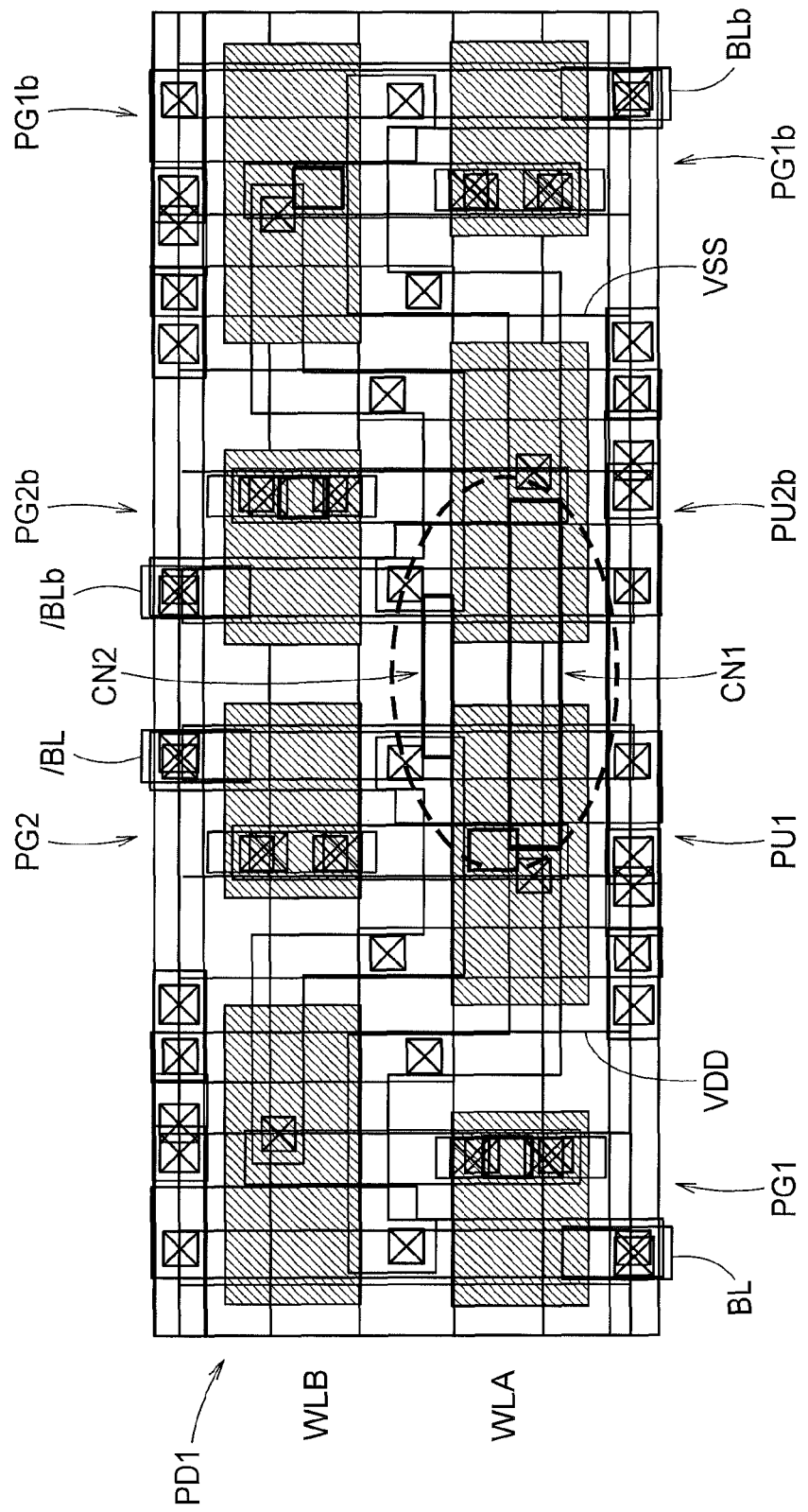
FIG. 18 shows a layout example of the semiconductor memory device 800 shown in FIG. 17.

FIG. 17 is a circuit diagram showing a configuration example of a semiconductor memory device 800 according to the eighth embodiment. FIG. 18 shows a layout example of the semiconductor memory device 800 shown in FIG. 17. In FIGS. 17 and 18, the same reference numerals as in FIGS. 9 and 10 indicate the same configurations and the explanation thereof is omitted.

As shown in FIGS. 17 and 18, the semiconductor memory device 800 further includes a third bit line BLb and a fourth bit line /BLb unlike in the fifth embodiment.

In this configuration, one end (drain) of a third select MOS transistor PG1b is connected to a third bit line BLb, the other end (source) of the third select MOS transistor PG1b is connected to a third node N1b, and the gate of the third select MOS transistor PG1b is connected to a second word line WLB.

One end (drain) of a fourth select MOS transistor PG2b is connected to a fourth bit line /BLb, the other end (source) of the fourth select MOS transistor PG2b is connected to a fourth node N2b, and the gate of the fourth select MOS transistor PG2b is connected to the second word line WLB.

Moreover, a first node N1 and the third node N1b are electrically connected to each other via a connecting wire CN1 provided in a metal layer M1.

Moreover, a second node N2 and the fourth node N2b are electrically connected to each other via a connecting wire CN2 provided in the metal layer M1.

A connecting wire CN may be provided in other layers, e.g., a wiring layer CS or a gate electrode layer GC.

This configuration allows the semiconductor memory device 800 to act as a two-port memory having two selecting lines (first and second word lines WLA and WLB).

Other configurations of the semiconductor memory device 700 are identical to those of the semiconductor memory device 500 according to the fifth embodiment.

As described above, the number of ports of the memory can be changed by correcting only metal layers or via layers in the semiconductor memory device according to the eighth embodiment. In the case of a small number of ports, a storage capacity can be larger than that of a large number of ports, thereby increasing the storage capacity per circuit area.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising first and second storages that enable writing and reading of data,
the first storage comprising:
a first decoding line, a first word line, a first bit line, a second decoding line, a second word line, a second bit line;
a first decoder including an output part that outputs a signal to the first decoding line;
a first control circuit including an output part that outputs a signal to the first word line based on a first decoding signal supplied to the first decoding line;
a first amplifier including an output part that outputs a signal to the first bit line;
a second decoder that outputs a signal to the second decoding line;
a second control circuit that outputs a second control signal to the second word line based on the signal supplied to the second decoding line;
a first memory cell that stores, in response to a first control signal supplied to the first word line, data based on a first data signal supplied to the first bit line and outputs a second data signal based on the stored data to the second bit line in response to the second control signal; and
a second amplifier that senses the signal of the second bit line and outputs a first output data signal based on the sensed signal,
the second storage comprising:
a third decoding line, a third word line, a third bit line, a fourth decoding line, a fourth word line, a fourth bit line;
a third control circuit including an output part that outputs a signal to the third word line based on a third decoding signal supplied to the third decoding line;
a fourth decoder that outputs a signal to the fourth decoding line;
a fourth control circuit that outputs a fourth control signal to the fourth word line based on a signal supplied to the fourth decoding line;
a second memory cell that stores, in response to a third control signal supplied to the third word line, data based on a third data signal supplied to the third bit line and outputs a fourth data signal based on the stored data to the fourth bit line in response to the fourth control signal; and
a third amplifier that senses the signal of the fourth bit line and outputs a second output data signal based on the sensed signal,
the first decoding line and the third decoding line being electrically connected to each other,
the first bit line and the third bit line being electrically connected to each other.

2. The semiconductor memory device according to claim 1, wherein the first word line is a first write word line,
the second word line is a first read word line,
the third word line is a second write word line,
the fourth word line is a second read word line,
the first bit line is a first write bit line,
the second bit line is a first read bit line,
the third bit line is a second write bit line,
the fourth bit line is a second read bit line,
the first amplifier is a first write amplifier,
the second amplifier is a first read sense amplifier, and
the third amplifier is a second read sense amplifier.

3. The semiconductor memory device according to claim 1, wherein the first storage further includes a first inverted bit line,
the first memory cell stores data, in response to the first control signal, based on the first data signal and a first inverted data signal that is supplied to the first inverted bit line and is inverted from a logic of the first data signal.

4. The semiconductor memory device according to claim 2, wherein the first decoder outputs the first decoding signal in response to a first input write signal, and
the first amplifier outputs the first data signal in response to a first input data signal.

5. The semiconductor memory device according to claim 2, wherein the first memory cell is connected to the first write word line, the first read word line, the first read bit line, and the first write bit line.

6. The semiconductor memory device according to claim 2, wherein the second memory cell is connected to the second write word line, the second read word line, the second read bit line, and the second write bit line.

7. The semiconductor memory device according to claim 5, wherein the second memory cell is connected to the second write word line, the second read word line, the second read bit line, and the second write bit line.

8. The semiconductor memory device according to claim 2, wherein the first storage further includes a first inverted bit line,
the first memory cell stores data, in response to the first control signal, based on the first data signal and a first inverted data signal that is supplied to the first inverted bit line and is inverted from a logic of the first data signal.

9. The semiconductor memory device according to claim 8, wherein the first storage further includes a second inverted bit line,
the second memory cell stores data, in response to the third control signal, based on the third data signal and a third inverted data signal that is supplied to the second inverted bit line and is inverted from a logic of the third data signal.

10. The semiconductor memory device according to claim 8, wherein the first decoder outputs the first decoding signal in response to a first input write signal, and
the first amplifier outputs the first data signal in response to a first input data signal.

11. The semiconductor memory device according to claim 8, wherein the first memory cell is connected to the first write word line, the first read word line, the first read bit line, and the first write bit line.

12. The semiconductor memory device according to claim 8, wherein the second memory cell is connected to the second write word line, the second read word line, the second read bit line, and the second write bit line.

13. The semiconductor memory device according to claim 11, wherein the second memory cell is connected to the second write word line, the second read word line, the second read bit line, and the second write bit line.

14. A semiconductor memory device comprising first and second storages that enable writing and reading of data,
the first storage comprising:
a first decoding line, a first word line, a first bit line, a second decoding line, a second word line, a second bit line;
a first decoder including an output part that outputs a signal to the first decoding line;

a first control circuit including an output part that outputs a signal to the first word line based on a first decoding signal supplied to the first decoding line;

a first amplifier including an output part that outputs a signal to the first bit line;

a second decoder that outputs a signal to the second decoding line;

a second control circuit that outputs a second control signal to the second word line based on the signal supplied to the second decoding line;

a first memory cell that stores, in response to a first control signal supplied to the first word line, data based on a first data signal supplied to the first bit line and outputs a second data signal based on the stored data to the second bit line in response to the second control signal;

a second amplifier that senses the signal of the second bit line and outputs a first output data signal based on the sensed signal, the second storage comprising:

a third word line, a third bit line, a fourth word line, a fourth bit line;

a second memory cell that stores, in response to a third control signal supplied to the third word line, data based on a third data signal supplied to the third bit line and outputs a fourth data signal based on the stored data to the fourth bit line in response to a fourth control signal; and a third amplifier that senses the signal of the fourth bit line and outputs a second output data signal based on the sensed signal, the first word line and the third word line being electrically connected to each other, the third word line being electrically connected to the output part of the first control circuit.

15. The semiconductor memory device according to claim 14, wherein the first word line is a first write word line, the second word line is a first read word line, the third word line is a second write word line, the fourth word line is a second read word line, the first bit line is a first write bit line, the second bit line is a first read bit line, the third bit line is a second write bit line, the fourth bit line is a second read bit line, the first amplifier is a first write amplifier, the second amplifier is a first read sense amplifier, and the third amplifier is a second read sense amplifier.

16. The semiconductor memory device according to claim 14, wherein the first storage further includes a first inverted bit line, the first memory cell stores data, in response to the first control signal, based on the first data signal and a first inverted data signal that is supplied to the first inverted bit line and is inverted from a logic of the first data signal.

17. The semiconductor memory device according to claim 15, wherein the first decoder outputs the first decoding signal in response to a first input write signal, and the first amplifier outputs the first data signal in response to a first input data signal.

18. The semiconductor memory device according to claim 15, wherein the first memory cell is connected to the first write word line, the first read word line, the first read bit line, and the first write bit line.

19. The semiconductor memory device according to claim 15, wherein the second memory cell is connected to the second write word line, the second read word line, the second read bit line, and the second write bit line.

20. The semiconductor memory device according to claim 16, wherein the second storage further includes a second inverted bit line, the second memory cell stores data, based on the third data signal and a third inverted data signal that is supplied to the second inverted bit line and is inverted from a logic of the third data signal.

* * * * *